(12) United States Patent
Matsukawa et al.

(10) Patent No.: US 11,949,379 B2
(45) Date of Patent: Apr. 2, 2024

(54) OSCILLATOR

(71) Applicant: SEIKO EPSON CORPORATION, Tokyo (JP)

(72) Inventors: Norihito Matsukawa, Shimosuwa (JP); Manabu Kondo, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/171,723

(22) Filed: Feb. 21, 2023

(65) Prior Publication Data

US 2023/0268886 A1 Aug. 24, 2023

(30) Foreign Application Priority Data

Feb. 22, 2022 (JP) ................................ 2022-025380

(51) Int. Cl.
| | | |
|---|---|---|
| *H03B 5/32* | (2006.01) | |
| *H01L 23/00* | (2006.01) | |
| *H01L 23/40* | (2006.01) | |
| *H03H 9/19* | (2006.01) | |
| *H03L 1/04* | (2006.01) | |

(52) U.S. Cl.
CPC ............... *H03B 5/32* (2013.01); *H01L 23/40* (2013.01); *H01L 24/05* (2013.01); *H01L 24/48* (2013.01); *H03H 9/19* (2013.01); *H03L 1/04* (2013.01); *H01L 2224/0557* (2013.01); *H01L 2224/484* (2013.01)

(58) Field of Classification Search
CPC .......... H03B 5/32; H01L 23/40; H01L 24/05; H01L 24/48; H01L 2224/0557; H01L 2224/484; H03H 9/19
See application file for complete search history.

(56) References Cited

U.S. PATENT DOCUMENTS

| | | | |
|---|---|---|---|
| 2018/0269832 A1* | 9/2018 | Obata | ...................... H03B 5/04 |
| 2020/0076438 A1* | 3/2020 | Hsieh | ................... H05K 1/0212 |
| 2020/0235701 A1* | 7/2020 | Nomura | ............... H03H 9/1021 |

FOREIGN PATENT DOCUMENTS

JP 2017-130861 A 7/2017

* cited by examiner

*Primary Examiner* — Jeffrey M Shin
(74) *Attorney, Agent, or Firm* — Harness, Dickey & Pierce, P.L.C.

(57) ABSTRACT

An oscillator includes a first resonator element, a first package that accommodates the first resonator element, a relay substrate on which the first package is mounted, a heater element that is attached to the first package or the relay substrate, a second package that accommodates the first package, and a heat insulating member that is provided at least between the second package and the relay substrate or between the relay substrate and the first package.

12 Claims, 15 Drawing Sheets

OSCILLATOR

The present application is based on, and claims priority from JP Application Serial Number 2022-025380, filed Feb. 22, 2022, the disclosure of which is hereby incorporated by reference herein in its entirety.

BACKGROUND

1. Technical Field

The present disclosure relates to an oscillator.

2. Related Art

JP-A-2017-130861 discloses a quartz crystal oscillator in which a package body in which a heater unit and a quartz crystal resonator are accommodated is stored in a container formed by a base substrate and a cover case. In this quartz crystal oscillator, the package body is supported by a plurality of spacers disposed on the base substrate.

However, in the quartz crystal oscillator of JP-A-2017-130861, in order to electrically couple the package body and the base substrate, a conductive path formed by metal plating is formed in the spacer. Therefore, heat is easily transferred between the base substrate and the package body via the conductive path that is formed by metal plating and formed in the spacer. Therefore, there is a problem that heat from the outside of the quartz crystal oscillator is easily transmitted to the quartz crystal resonator accommodated in the package body via the spacer, and oscillation characteristics of the quartz crystal oscillator are easily affected by an ambient temperature.

SUMMARY

An oscillator includes: a first resonator element; a first package that accommodates the first resonator element; a relay substrate on which the first package is mounted; a heater element that is attached to the first package or the relay substrate; a second package that accommodates the first package; and a heat insulating member that is provided at least between the second package and the relay substrate or between the relay substrate and the first package.

DESCRIPTION OF EXEMPLARY EMBODIMENTS

Next, embodiments of the present disclosure will be described with reference to the drawings.

For convenience of description, an X axis, a Y axis, and a Z axis are shown in each figure as three axes orthogonal to one another. A direction along the X axis is referred to as an "X direction", a direction along the Y axis is referred to as a "Y direction", and a direction along the Z axis is referred to as a "Z direction". An arrow tip side in each axial direction is also referred to as a "plus side", and an arrow proximal end side is also referred to as a "minus side". For example, the Y direction refers to both a plus side in the Y direction and a minus side in the Y direction. A plus side in the Z direction is also referred to as "upper", and a minus side in the Z direction is also referred to as "lower". A plan view seen from the Z direction is also simply referred to as a "plan view".

1. First Embodiment

An oscillator 1 according to a first embodiment will be described with reference to FIGS. 1, 2, and 3.

Figure 1:
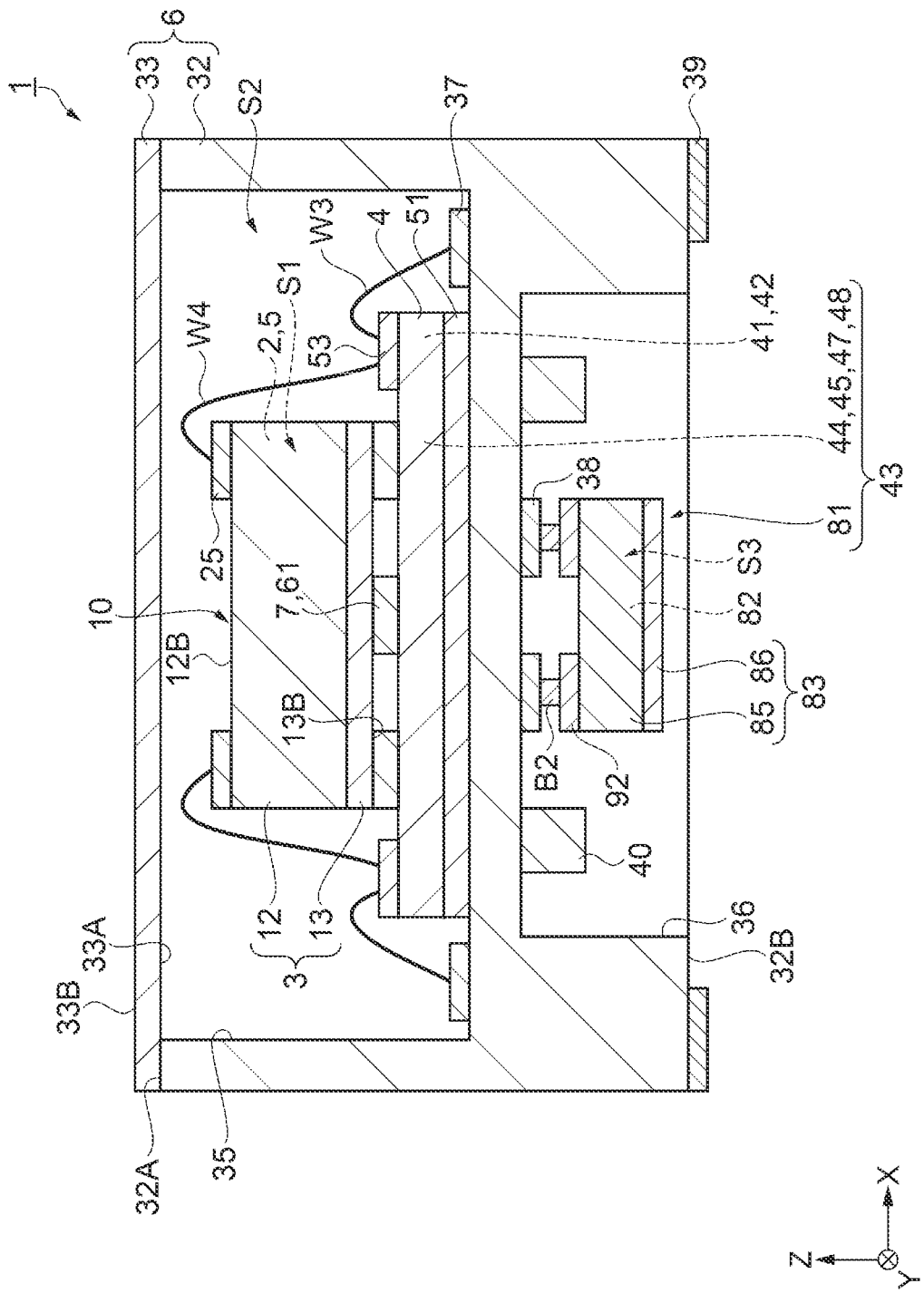
FIG. 1 is a cross-sectional view of an oscillator according to a first embodiment.

The oscillator 1 shown in FIG. 1 is an oven controlled crystal oscillator (OCXO).

As shown in FIG. 1, the oscillator 1 includes a first resonator element 2, a first package 3 that accommodates the first resonator element 2, a semiconductor device 4 as a relay substrate on which the first package 3 is mounted, a heater element 5 that heats the first resonator element 2, a second package 6 that accommodates the first package 3, and a heat insulating member 7 that is provided between the first package 3 and the semiconductor device 4. In the embodiment, the first resonator element 2 and the first package 3 are also collectively referred to as a first resonator 10.

In the embodiment, the oscillator 1 further includes a second resonator 81. The second resonator 81 constitutes a part of a phase locked loop (PLL) circuit 43 to be described later.

In such an oscillator 1, the first resonator element 2 is heated by heat of the heater element 5, and the first resonator element 2 is maintained at a desired temperature, so that frequency variation of an oscillation signal output from the oscillator 1 is prevented, and excellent oscillation characteristics are implemented.

First, the first resonator 10 will be described.

Figure 2:
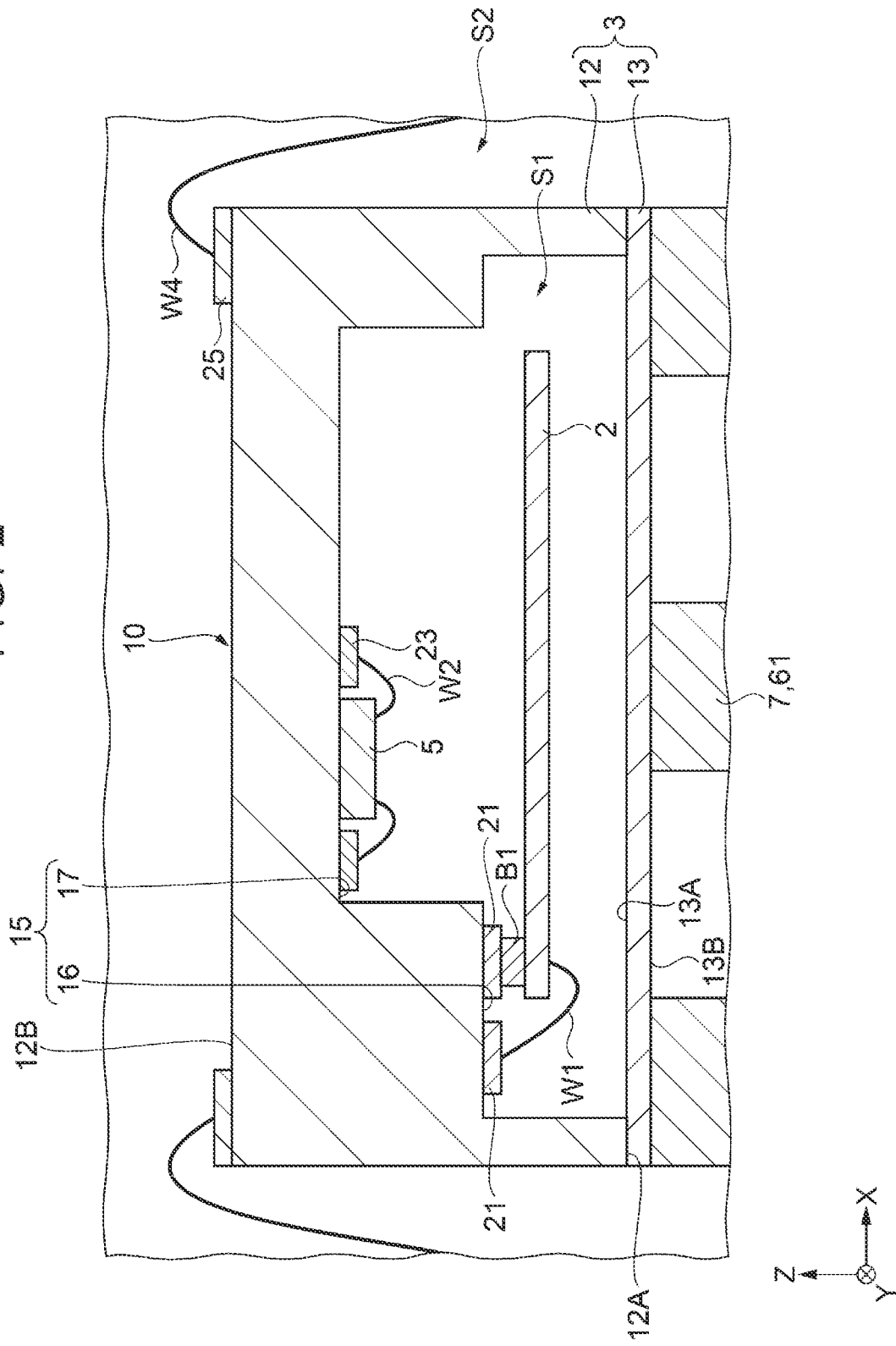
FIG. 2 is a cross-sectional view of a first resonator in FIG. 1.

As shown in FIG. 2, the first resonator 10 includes the first resonator element 2 and the first package 3.

The first resonator element 2 is formed of a quartz crystal substrate having a flat plate shape. In the embodiment, the first resonator element 2 is formed of an SC cut quartz crystal substrate. Excitation electrodes (not shown) are provided on an upper surface and a lower surface of the first resonator element 2.

However, the configuration of the first resonator element 2 is not particularly limited. The first resonator element 2 may be formed of, for example, an AT cut quartz crystal substrate or a BT cut quartz crystal substrate other than the SC cut quartz crystal substrate. The first resonator element 2 may be, for example, a resonator element in which a plurality of resonating arms perform flexural resonation in an in-plane direction, or a resonator element in which a plurality of resonating arms perform the flexural resonation in an out-of-plane direction. Further, the first resonator element 2 may be, for example, a resonator element in which a piezoelectric body other than a quartz crystal is used. Further, the first resonator element 2 may be, for example, a surface acoustic wave (SAW) resonator, or a micro electro mechanical systems (MEMS) resonator in which a piezoelectric element is disposed on a semiconductor substrate made of silicon or the like.

The first package 3 includes a first base substrate 12 and a first lid 13.

The first base substrate 12 has a box shape in which a concave portion 15 is formed. The first base substrate 12 has a first surface 12A and a second surface 12B that is in a front-back relationship with the first surface 12A. The concave portion 15 has a shape that opens in the first surface 12A and is recessed from the first surface 12A toward the second surface 12B.

The first lid 13 has a flat plate shape. The first lid 13 has a third surface 13A which is a surface facing the first base substrate 12, and a fourth surface 13B that is in a front-back relationship with the third surface 13A.

The first surface 12A of the first base substrate 12 and the third surface 13A of the first lid 13 are bonded to each other via a sealing member (not shown) so as to close an opening of the concave portion 15. As a result, the concave portion 15 is hermetically sealed, and a first accommodation space S1 is formed in the first package 3. Then, the first resonator element 2 is accommodated in the first accommodation space S1.

In the embodiment, the first surface 12A is a lower surface of the first base substrate 12. The second surface 12B that is in the front-back relationship with the first surface 12A is an upper surface of the first base substrate 12. The third surface 13A is an upper surface of the first lid 13. The fourth surface 13B is a lower surface of the first lid 13. In addition, by bonding the first surface 12A of the first base substrate 12 and the third surface 13A of the first lid 13, the second surface 12B becomes an upper surface of the first package 3, and the fourth surface 13B becomes a lower surface of the first package 3.

In the embodiment, the first base substrate 12 is made of a ceramic material such as alumina or titania. The first lid 13 is made of a metal material such as Kovar. However, the constituent materials of the first base substrate 12 and the first lid 13 are not particularly limited.

The first accommodation space S1 is airtight and is in a reduced pressure state, preferably in a state close to vacuum. That is, the inside of the first package 3 is depressurized. As a result, a viscosity resistance of the first accommodation space S1 is reduced, and resonation characteristics of the first resonator element 2 are improved. An atmosphere of the first accommodation space S1 is not particularly limited.

The concave portion 15 includes a plurality of concave portions. In the embodiment, the concave portion 15 includes a concave portion 16 that opens in the first surface 12A of the first base substrate 12, and a concave portion 17 that opens in a bottom surface of the concave portion 16 and has an opening smaller than that of the concave portion 16. However, the configuration of the concave portion 15 is not particularly limited.

A plurality of internal terminals 21 are disposed on the bottom surface of the concave portion 16. The plurality of internal terminals 21 are electrically coupled to the first resonator element 2 via conductive bonding members B1 and conductive bonding wires W1. Specifically, the internal terminal 21 is electrically coupled to the excitation electrodes (not shown) provided on the upper surface and the lower surface of the first resonator element 2 via the bonding members B1 and the bonding wires W1.

The bonding member B1 is a metal bump formed of gold, copper, or the like. The bonding wire W1 is a metal wire formed of gold, copper, or the like.

One end portion of the first resonator element 2 is fixed to the bottom surface of the concave portion 16 via the bonding member B1. In the embodiment, the excitation electrodes (not shown) provided on the upper surface and the lower surface of the first resonator element 2 are electrically coupled to the first base substrate 12 via the bonding member B1 and the bonding wire W1, respectively. A method for supporting the first resonator element 2 is not limited to a one-point support by the bonding member B1, and may be, for example, a two-point support by two bonding members.

A plurality of internal terminals 23 and the heater element 5 are disposed on a bottom surface of the concave portion 17.

The heater element 5 includes a heating circuit (not shown) and a temperature sensor (not shown). The heating circuit functions as a heat generating portion that heats the first resonator element 2. The temperature sensor functions as a temperature detection unit that detects an ambient temperature, in particular, a temperature of the first resonator element 2.

The heater element 5 is bonded to the bottom surface of the concave portion 17 by a bonding member (not shown). That is, in the embodiment, the heater element 5 is attached to the first package 3, and specifically, the heater element 5 is accommodated in the first package 3.

Although the heater element 5 is accommodated in the first package 3 in the embodiment, the heater element 5 may not be accommodated in the first package 3. For example, the heater element 5 may be attached to an outer peripheral surface of the first package 3.

However, since the heater element 5 is accommodated in the first package 3, the heat of the heater element 5 can be efficiently transferred to the first resonator element 2. Therefore, the heater element 5 can be efficiently driven, and the temperature of the first resonator element 2 can be easily maintained at a desired temperature. Accordingly, it is preferable that the heater element 5 is accommodated in the first package 3.

The plurality of internal terminals 23 are electrically coupled to the heater element 5 via conductive bonding wires W2.

The bonding wire W2 is a metal wire formed of gold, copper, or the like. A method for coupling the internal terminal 23 and the heater element 5 is not limited to the wire bonding using a metal wire, and may be flip chip bonding using, for example, a bump member.

A plurality of external terminals 25 are disposed on the second surface 12B of the first base substrate 12. The external terminals 25 are electrically coupled to the internal terminals 21 and 23 via an internal wiring (not shown) formed in the first base substrate 12.

Next, the second package 6 that accommodates the first package 3 will be described.

As shown in FIG. 1, the second package 6 includes a second base substrate 32 and a second lid 33.

The second base substrate 32 has a box shape. The second base substrate 32 includes a concave portion 35 and a concave portion 36. The concave portion 35 has a shape that opens in an upper surface 32A of the second base substrate 32, and is recessed from the upper surface 32A toward a lower surface 32B. The concave portion 36 has a shape that opens in the lower surface 32B that is in a front-back relationship with the upper surface 32A, and is recessed from the lower surface 32B toward the upper surface 32A. Therefore, the second base substrate 32 has a substantially H shape in a longitudinal sectional view.

A plurality of internal terminals 37 are disposed on a bottom surface of the concave portion 35. The plurality of internal terminals 37 are electrically coupled to the semiconductor device 4 as the relay substrate via bonding wires W3.

A plurality of internal terminals 38 are disposed on a bottom surface of the concave portion 36. The plurality of internal terminals 38 are electrically coupled to the second resonator 81 via bonding members B2.

A plurality of external terminals 39 are disposed on the lower surface 32B of the second base substrate 32. The oscillator 1 is electrically coupled to an external device (not shown) via the external terminals 39.

The internal terminals 37, the internal terminals 38, and the external terminals 39 are electrically coupled to one another via internal wirings (not shown) in the second base substrate 32.

Circuit components 40 such as bypass capacitors are disposed on the bottom surface of the concave portion 36. The circuit components 40 are bonded to the bottom surface of the concave portion 36 by a conductive bonding member (not shown). The circuit components 40 are electrically coupled to the internal wirings (not shown) in the second base substrate 32 via the conductive bonding member (not shown).

The second lid 33 has a flat plate shape. The second lid 33 has a lower surface 33A which is a surface facing the second base substrate 32, and an upper surface 33B that is in a front-back relationship with the lower surface 33A.

The upper surface 32A of the second base substrate 32 and the lower surface 33A of the second lid 33 are bonded to each other via a sealing member (not shown) so as to close an opening of the concave portion 35. As a result, the concave portion 35 is hermetically sealed, and a second accommodation space S2 is formed in the second package 6. Then, the first resonator 10 is accommodated in the second accommodation space S2. In other words, the first package 3 is accommodated in the second accommodation space S2.

In the embodiment, the second base substrate 32 is made of a ceramic material such as alumina or titania. The second lid 33 is made of a metal material such as Kovar. However, the constituent materials of the second base substrate 32 and the second lid 33 are not particularly limited.

The second accommodation space S2 is airtight and is in the reduced pressure state, preferably in the state close to vacuum. That is, the inside of the second package 6 is depressurized. Accordingly, the second accommodation space S2 can exhibit excellent heat insulating properties, and external heat of the oscillator 1 is less likely to be transferred to the first package 3. Therefore, the first resonator element 2 is less likely to be affected by the external heat, and the first resonator element 2 is easily maintained at the desired temperature by the heat of the heater element 5. An atmosphere of the second accommodation space S2 is not particularly limited.

The plurality of internal terminals 37 and the semiconductor device 4 as the relay substrate are disposed on the bottom surface of the concave portion 35. The plurality of internal terminals 37 are electrically coupled to the semiconductor device 4.

Next, the semiconductor device 4 as the relay substrate will be described.

The semiconductor device 4 as the relay substrate is disposed between the first package 3 and the second package 6.

The semiconductor device 4 has a flat plate shape. The semiconductor device 4 includes a semiconductor substrate (not shown) and a circuit layer (not shown) formed on the semiconductor substrate. Specifically, the semiconductor device 4 is an integrated circuit (IC) chip.

In the embodiment, the semiconductor device 4 includes a heater control circuit 41 that controls operations of the heater element 5, and an oscillation circuit 42 that causes the first resonator element 2 to oscillate so as to generate an oscillation signal.

The heater control circuit 41 is a circuit for controlling an amount of current flowing through the heating circuit (not shown) included in the heater element 5 based on an output signal of the temperature sensor (not shown) included in the heater element 5 to maintain the first resonator element 2 at a constant temperature. For example, when a current temperature determined based on the output signal of the temperature sensor is lower than a set reference temperature, the heater control circuit 41 performs control such that a desired current flows through the heating circuit, and when the current temperature is higher than the reference temperature, the heater control circuit 41 performs control such that the current does not flow through the heating circuit.

The oscillation circuit 42 is a circuit for generating the oscillation signal by outputting an excitation signal for exciting the first resonator element 2 and causing the first resonator element 2 to oscillate.

In the embodiment, the oscillator 1 further includes the phase locked loop (PLL) circuit 43. The semiconductor device 4 includes a part of the PLL circuit 43. The PLL circuit 43 will be described later.

In addition to the heater control circuit 41, the oscillation circuit 42, and the PLL circuit 43, the semiconductor device 4 may include a temperature compensation circuit that corrects the resonation characteristics of the first resonator element 2 according to a temperature change, an electrostatic protection circuit, and the like.

The semiconductor device 4 is disposed on the bottom surface of the concave portion 35 of the second package 6. A bonding member 51 is provided between a lower surface of the semiconductor device 4 and the bottom surface of the concave portion 35. The semiconductor device 4 is fixed to the concave portion 35 via the bonding member 51. That is, the semiconductor device 4 is fixed to the second package 6 via the bonding member 51. The bonding member 51 is not particularly limited, and may be, for example, an insulating adhesive or a conductive adhesive.

A plurality of coupling terminals 53 are disposed on an upper surface of the semiconductor device 4. The coupling terminals 53 are electrically coupled to the heater control circuit 41, the oscillation circuit 42, and the PLL circuit 43 included in the semiconductor device 4.

The first resonator 10 is disposed on the upper surface of the semiconductor device 4. In other words, the first package 3 included in the first resonator 10 is mounted on the upper surface of the semiconductor device 4 as the relay substrate.

Next, the heat insulating member 7 will be described.

The heat insulating member 7 is provided between the first package 3 and the semiconductor device 4 as the relay substrate. Specifically, the heat insulating member 7 is provided between the upper surface of the semiconductor device 4 and the fourth surface 13B which is the lower surface of the first package 3. The first package 3 is fixed to the semiconductor device 4 via the heat insulating member 7.

The first package 3 is coupled to the second package 6 via the heat insulating member 7 provided between the first package 3 and the semiconductor device 4, the semiconductor device 4, and the bonding member 51 provided between the semiconductor device 4 and the second package 6.

By providing the heat insulating member 7 between the first package 3 and the semiconductor device 4, the external heat of the oscillator 1 is less likely to be transferred to the first package 3. Therefore, the first resonator element 2 is less likely to be affected by the external heat, and the first resonator element 2 is easily maintained at the desired temperature by the heat of the heater element 5.

In the embodiment, as described above, the heater element 5 is attached to the first package 3. That is, the heat insulating member 7 is located in the middle of a heat conduction path from the heater element 5 to the second package 6.

Since the heat insulating member 7 is located in the middle of the heat conduction path from the heater element 5 to the second package 6, the heat of the heater element 5 is less likely to escape to the second package 6 via the first package 3, and the heat of the heater element 5 can be efficiently transferred to the first resonator element 2. Therefore, the heater element 5 can be efficiently driven, and the temperature of the first resonator element 2 can be further easily maintained at the desired temperature.

A material constituting the heat insulating member 7 is not particularly limited as long as the material has a sufficiently low thermal conductivity. For example, an insulating resin such as a polyimide resin, a silicone resin, or an epoxy resin can be used as the material constituting the heat insulating member 7. These insulating resins may contain an inorganic material having a sufficiently low thermal conductivity, such as silica, as a filler.

When the material constituting the heat insulating member 7 has an adhesive force, the first package 3 and the semiconductor device 4 can be fixed to each other via the heat insulating member 7 by using the heat insulating member 7 as an adhesive. However, the material constituting the heat insulating member 7 may not have the adhesive force. When the heat insulating member 7 does not have the adhesive force, the first package 3 and the heat insulating member 7, and the semiconductor device 4 and the heat insulating member 7 can be respectively fixed via a bonding member such as an adhesive.

In addition, the heat insulating member 7 includes a plurality of coupling portions 61 disposed to be separated from one another. The plurality of coupling portions 61 are disposed to be separated from one another in the X direction and the Y direction between the upper surface of the semiconductor device 4 and the fourth surface 13B which is the lower surface of the first package 3. As a result, a contact area between the first package 3 and the heat insulating member 7 and a contact area between the semiconductor device 4 and the heat insulating member 7 can be reduced, and the external heat of the oscillator 1 is less likely to be transferred to the first package 3 via the heat insulating member 7.

In the embodiment, the coupling portion 61 has a columnar shape. However, a shape of the coupling portion 61 is not particularly limited. The coupling portion 61 may have, for example, a frustum shape.

In addition, the heat insulating member 7 may not include the plurality of coupling portions 61, and may be disposed so as to spread over the entire surface in the X direction and the Y direction without a gap between the upper surface of the semiconductor device 4 and the fourth surface 13B which is the lower surface of the first package 3. As a result, the contact area between the first package 3 and the heat insulating member 7 and the contact area between the semiconductor device 4 and the heat insulating member 7 are increased, and adhesive strength between the first package 3 and the semiconductor device 4 is increased. However, the smaller the contact area between the first package 3 and the heat insulating member 7 and the contact area between the semiconductor device 4 and the heat insulating member 7, the higher the heat insulating properties between the first package 3 and the semiconductor device 4, and thus the heat insulating member 7 preferably includes the plurality of coupling portions 61.

Next, electrical coupling between the semiconductor device 4 as the relay substrate and the second package 6 and electrical coupling between the semiconductor device 4 and the first package 3 will be described.

The plurality of coupling terminals 53 disposed on the upper surface of the semiconductor device 4 are respectively coupled to the internal terminals 37 disposed on the bottom surface of the concave portion 35 in the second base substrate 32 and the external terminals 25 disposed on the second surface 12B which is an upper surface of the first resonator 10. Specifically, a part of the plurality of coupling terminals 53 are electrically coupled to the internal terminals 37 via the conductive bonding wires W3. The remaining coupling terminals 53, that is, the coupling terminals 53 that are not electrically coupled to the internal terminals 37 are electrically coupled to the external terminals 25 via conductive bonding wires W4.

That is, the second package 6 and the semiconductor device 4 as the relay substrate are electrically coupled to each other via the bonding wires W3, and the semiconductor device 4 and the first package 3 are electrically coupled to each other via the bonding wires W4.

The bonding wires W3 and W4 are metal wires formed of gold, copper, or the like.

Since the bonding wire W3 is a metal wire, the bonding wire W3 can serve as a heat conduction path between the second package 6 and the semiconductor device 4 as the relay substrate. Similarly, since the bonding wire W4 is a metal wire, the bonding wire W4 can serve as a heat conduction path between the semiconductor device 4 as the relay substrate and the first package 3.

However, since the bonding wires W3 and W4 are elongated linear conductive paths, it is possible to effectively prevent heat conduction as compared with a conductive path formed by metal plating described in the related art.

Therefore, since the semiconductor device 4 as the relay substrate and the second package 6 are electrically coupled to each other via the bonding wire W3, the external heat of the oscillator 1 is less likely to be transferred from the second package 6 to the semiconductor device 4. That is, the external heat of the oscillator 1 is less likely to be transferred to the first package 3 via the second package 6 and the semiconductor device 4. Therefore, the first resonator element 2 is less likely to be affected by the external heat, and the first resonator element 2 is easily maintained at the desired temperature by the heat of the heater element 5.

In addition, since the semiconductor device 4 as the relay substrate and the first package 3 are electrically coupled to each other via the bonding wire W4, the external heat of the oscillator 1 is less likely to be transferred to the first package 3 via the second package 6 and the semiconductor device 4. Therefore, the first resonator element 2 is less likely to be affected by the external heat, and the first resonator element 2 is easily maintained at the desired temperature by the heat of the heater element 5.

Next, the PLL circuit 43 will be described.

The PLL circuit 43 is a circuit that uses an oscillation signal generated by the oscillation circuit 42 causing the first resonator element 2 to oscillate as a reference signal and outputs an oscillation signal having a predetermined frequency synchronized with the reference signal.

In the embodiment, the oscillation signal output from the PLL circuit 43 is the oscillation signal output from the oscillator 1.

The PLL circuit 43 includes an oscillation circuit 44, a phase comparator 45, a loop filter 47, a dividing circuit 48, and the second resonator 81.

The semiconductor device 4 includes a part of the PLL circuit 43. Specifically, the semiconductor device 4 includes the oscillation circuit 44, the phase comparator 45, the loop filter 47, and the dividing circuit 48 as a part of the PLL circuit 43.

A voltage-controlled oscillator includes the oscillation circuit 44 and the second resonator 81.

The oscillation circuit 44 is a circuit for causing a second resonator element 82 included in the second resonator 81 to oscillate. The oscillation circuit 44 is a circuit for generating the oscillation signal by outputting an excitation signal for exciting the second resonator element 82 and causing the second resonator element 82 to oscillate.

The phase comparator 45 detects a phase difference between the oscillation signal generated by the oscillation circuit 42 causing the first resonator element 2 to oscillate and the oscillation signal divided by the dividing circuit 48. The phase comparator 45 outputs the detected phase difference as an error signal.

The loop filter 47 is a low-pass filter, and removes a high-frequency component from the error signal output from the phase comparator 45. The loop filter 47 outputs the error signal from which the high-frequency component is removed as a frequency control signal for controlling the voltage-controlled oscillator including the oscillation circuit 44 and the second resonator 81. The frequency control signal is a DC signal converted into a voltage.

The voltage-controlled oscillator including the oscillation circuit 44 and the second resonator 81 oscillates at a frequency corresponding to the voltage of the frequency control signal output from the loop filter 47, and outputs an oscillation signal.

The oscillation signal output from the voltage-controlled oscillator including the oscillation circuit 44 and the second resonator 81 is input to the dividing circuit 48.

The dividing circuit 48 divides the oscillation signal output from the voltage-controlled oscillator including the oscillation circuit 44 and the second resonator 81. The dividing circuit 48 outputs the divided oscillation signal to the phase comparator 45.

In such a PLL circuit 43, a frequency of the oscillation signal output from the voltage-controlled oscillator including the oscillation circuit 44 and the second resonator 81 is a frequency obtained by calculating a frequency of the oscillation signal generated by the oscillation circuit 42 causing the first resonator element 2 to oscillate at a magnification corresponding to a division ratio of the dividing circuit 48.

That is, in such a PLL circuit 43, an oscillation frequency of the second resonator element 82 is controlled based on the oscillation signal generated by the oscillation circuit 42 causing the first resonator element 2 to oscillate.

The configuration of the PLL circuit 43 is not particularly limited. For example, the PLL circuit 43 may be a fractional division PLL circuit or an integer division PLL circuit. The PLL circuit 43 may include both the fractional division PLL circuit and the integer division PLL circuit.

Next, the second resonator 81 will be described.

The second resonator 81 constitutes the part of the PLL circuit 43 as described above.

Figure 3:
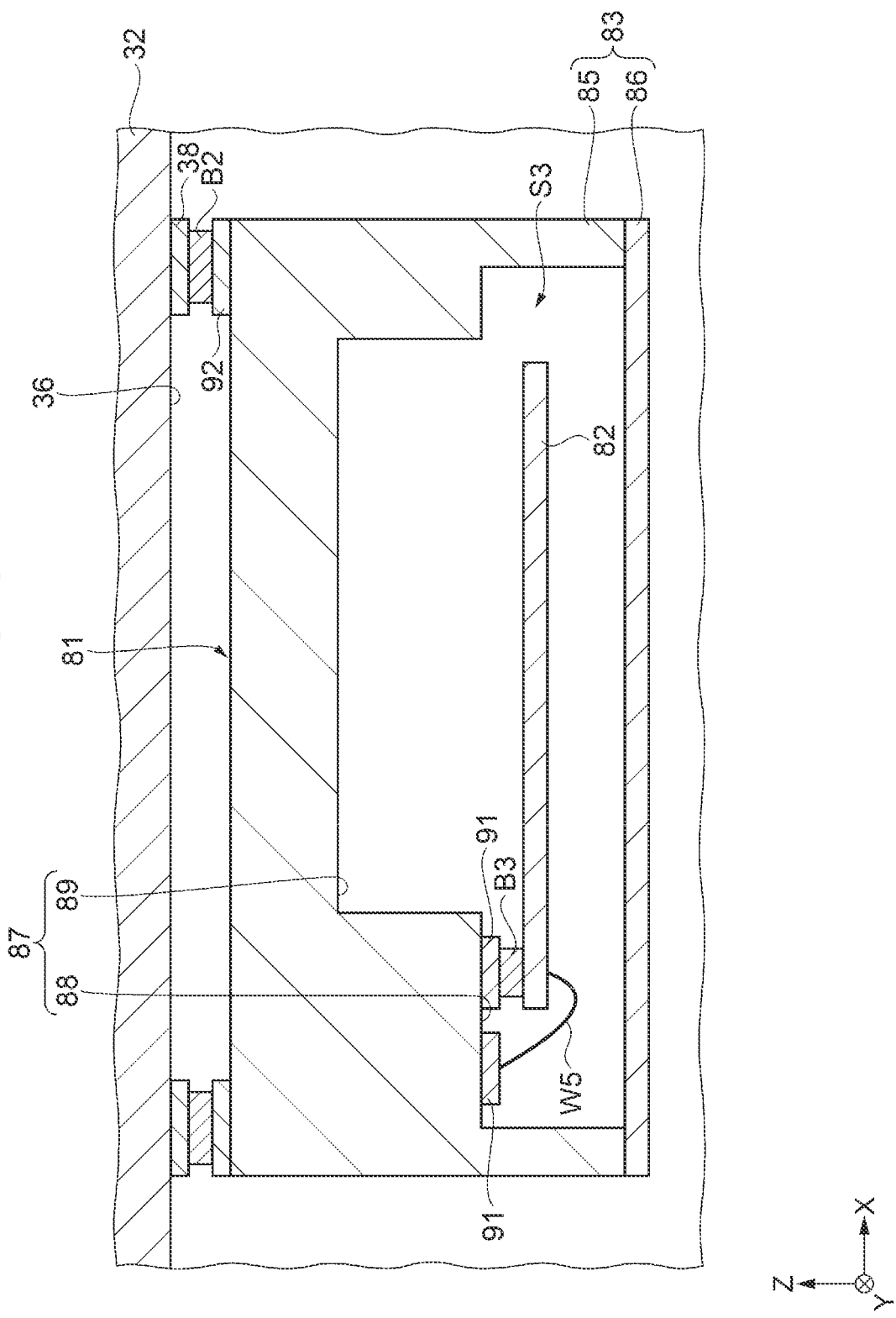
FIG. 3 is a cross-sectional view of a second resonator in FIG. 1.

As shown in FIG. 3, the second resonator 81 includes the second resonator element 82 and a third package 83.

The second resonator element 82 is formed of a quartz crystal substrate having a flat plate shape. In the embodiment, the second resonator element 82 is formed of the AC cut quartz crystal substrate. Excitation electrodes (not shown) are provided on an upper surface and a lower surface of the second resonator element 82.

However, the configuration of the second resonator element 82 is not particularly limited. The second resonator element 82 may be formed of, for example, the SC cut quartz crystal substrate or the BT cut quartz crystal substrate other than the AT cut quartz crystal substrate. The second resonator element 82 may be, for example, a resonator element in which a plurality of resonating arms perform flexural resonation in an in-plane direction, or a resonator element in which a plurality of resonating arms perform the flexural resonation in an out-of-plane direction. Further, the second resonator element 82 may be, for example, a resonator element in which a piezoelectric body other than a quartz crystal is used. Further, the second resonator element 82 may be, for example, a SAW resonator, or a MEMS resonator in which a piezoelectric element is disposed on a semiconductor substrate made of silicon or the like.

The third package 83 includes a third base substrate 85 and a third lid 86.

The third base substrate 85 has a box shape in which a concave portion 87 is formed. The concave portion 87 has a shape that opens in a lower surface of the third base substrate 85, and is recessed from the lower surface toward an upper surface of the third base substrate 85.

The third lid 86 has a flat plate shape. The third lid 86 is disposed such that an upper surface of the third lid 86 faces the lower surface of the third base substrate 85.

The lower surface of the third base substrate 85 and the upper surface of the third lid 86 are bonded to each other via a sealing member (not shown) so as to close an opening of the concave portion 87. As a result, the concave portion 87 is hermetically sealed, and a third accommodation space S3 is formed in the third package 83. Then, the second resonator element 82 is accommodated in the third accommodation space S3.

In the embodiment, the third base substrate 85 is made of a ceramic material such as alumina or titania. The third lid 86 is made of a metal material such as Kovar. However, the constituent materials of the third base substrate 85 and the third lid 86 are not particularly limited.

The third accommodation space S3 is airtight and is in the reduced pressure state, preferably in the state close to vacuum. That is, the inside of the third package 83 is depressurized. As a result, a viscosity resistance of the third accommodation space S3 is reduced, and resonation characteristics of the second resonator element 82 are improved. An atmosphere of the third accommodation space S3 is not particularly limited.

The concave portion 87 includes a plurality of concave portions. In the embodiment, the concave portion 87 includes a concave portion 88 that opens in the lower surface of the third base substrate 85, and a concave portion 89 that opens in a bottom surface of the concave portion 88 and has an opening smaller than that of the concave portion 88. However, the configuration of the concave portion 87 is not particularly limited.

A plurality of internal terminals 91 are disposed on the bottom surface of the concave portion 88. The plurality of internal terminals 91 are electrically coupled to the second resonator element 82 via conductive bonding members B3 and conductive bonding wires W5. Specifically, the internal terminal 91 is electrically coupled to the excitation electrodes (not shown) provided on the upper surface and the lower surface of the second resonator element 82 via the bonding members B3 and the bonding wires W5.

The bonding member B3 is a metal bump formed of gold, copper, or the like. The bonding wire W5 is a metal wire formed of gold, copper, or the like.

One end portion of the second resonator element 82 is fixed to the bottom surface of the concave portion 88 via the bonding member B3. In the embodiment, the excitation electrodes (not shown) provided on the upper surface and the lower surface of the second resonator element 82 are electrically coupled to the third base substrate 85 via the bonding member B3 and the bonding wire W5, respectively. A method for supporting the second resonator element 82 is not limited to the one-point support by the bonding member B3, and may be, for example, the two-point support by two bonding members.

A plurality of external terminals 92 are disposed on the upper surface of the third base substrate 85. The external terminals 92 are electrically coupled to the internal terminals 91 via an internal wiring (not shown) formed in the third base substrate 85.

As shown in FIGS. 1 and 3, the external terminals 92 are electrically coupled to the internal terminals 38 disposed on the bottom surface of the concave portion 36 of the second base substrate 32 via the bonding members B2.

The third package 83 accommodating the second resonator element 82 is attached to the second package 6 via the bonding members B2.

As described above, the heat insulating member 7 is located in the middle of the heat conduction path from the heater element 5 to the second package 6. Therefore, the heat of the heater element 5 is not easily transferred to the second resonator element 82, and a temperature fluctuation of the second resonator element 82 due to the heat of the heater element 5 is prevented. By preventing the temperature fluctuation of the second resonator element 82, it is possible to prevent deterioration of a phase noise characteristic of the oscillation signal output from the voltage-controlled oscillator including the oscillation circuit 44 and the second resonator 81.

The oscillator 1 is described above.

In the embodiment, the oscillator 1 includes the PLL circuit 43, but the PLL circuit 43 may be omitted. When the PLL circuit 43 is omitted, the oscillation signal generated by the oscillation circuit 42 causing the first resonator element 2 to oscillate is the oscillation signal output from the oscillator 1.

As described above, according to the embodiment, the following effects can be obtained.

The oscillator 1 includes the first resonator element 2, the first package 3 that accommodates the first resonator element 2, the semiconductor device 4 as the relay substrate on which the first package 3 is mounted, the heater element 5 that is attached to the first package 3, the second package 6 that accommodates the first package 3, and the heat insulating member 7 that is provided between the semiconductor device 4 and the first package 3.

Accordingly, the external heat of the oscillator 1 is less likely to be transferred to the first package 3. Therefore, the first resonator element 2 is less likely to be affected by the external heat, and the first resonator element 2 is easily maintained at the desired temperature by the heat of the heater element 5. That is, the oscillation characteristics of the oscillator 1 are less likely to be affected by the ambient temperature, and the oscillation characteristics of the oscillator 1 are stabilized.

2. Second Embodiment

Next, an oscillator 1a according to a second embodiment will be described with reference to FIGS. 4 and 5.

The oscillator 1a according to the second embodiment is similar to the oscillator 1 according to the first embodiment except that the oscillator 1a includes, instead of the semiconductor device 4, a first semiconductor device 101 including the heater control circuit 41 that controls the heater element 5 and a second semiconductor device 102 including the oscillation circuit 42 that causes the first resonator element 2 to oscillate and generates an oscillation signal, that the first semiconductor device 101 is used as the relay substrate, and that the second semiconductor device 102 is accommodated in the first package 3.

A first resonator 10a according to the second embodiment is similar to the first resonator 10 according to the first embodiment except that the second semiconductor device 102 is accommodated in the first package 3 included in the first resonator 10a.

The same components as those of the first embodiment described above are denoted by the same reference numerals, and the description thereof will be omitted.

Figure 4:
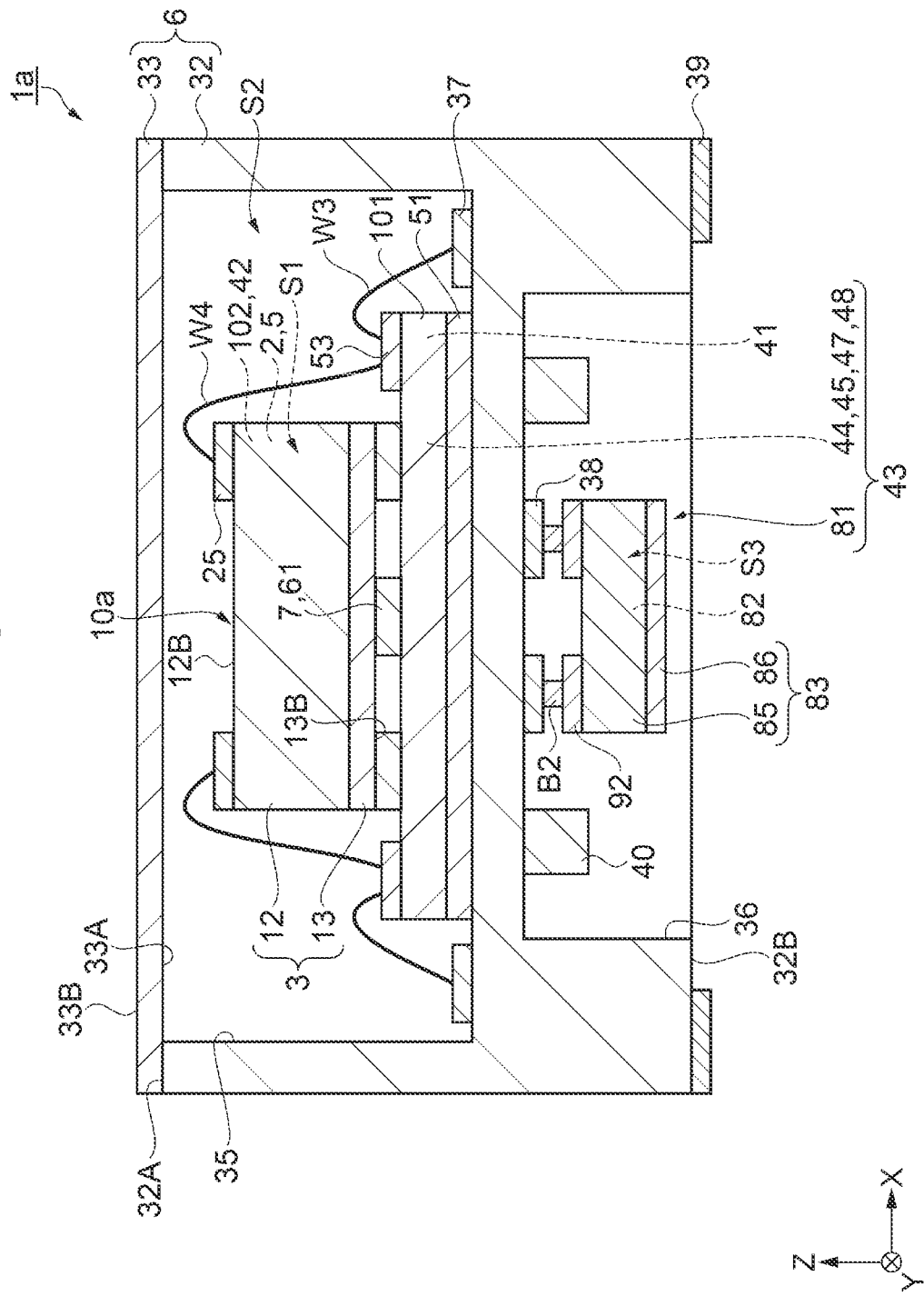
FIG. 4 is a cross-sectional view of an oscillator according to a second embodiment.

As shown in FIG. 4, the oscillator 1a includes the first semiconductor device 101 and the second semiconductor device 102. The first semiconductor device 101 includes the heater control circuit 41. The second semiconductor device 102 includes the oscillation circuit 42 and a temperature sensor (not shown). The temperature sensor functions as a temperature detection unit that detects an ambient temperature, in particular, a temperature of the first resonator element 2.

The heater control circuit 41 is a circuit for controlling an amount of current flowing through the heating circuit (not shown) included in the second heater element 5 based on an output signal of the temperature sensor (not shown) included in the second semiconductor device 102 to maintain the first resonator element 2 at a constant temperature. For example, when a current temperature determined based on the output signal of the temperature sensor is lower than a set reference temperature, the heater control circuit 41 performs control such that a desired current flows through the heating circuit, and when the current temperature is higher than the reference temperature, the heater control circuit 41 performs control such that the current does not flow through the heating circuit.

The first semiconductor device 101 as the relay substrate is disposed between the first package 3 and the second package 6.

Figure 5:
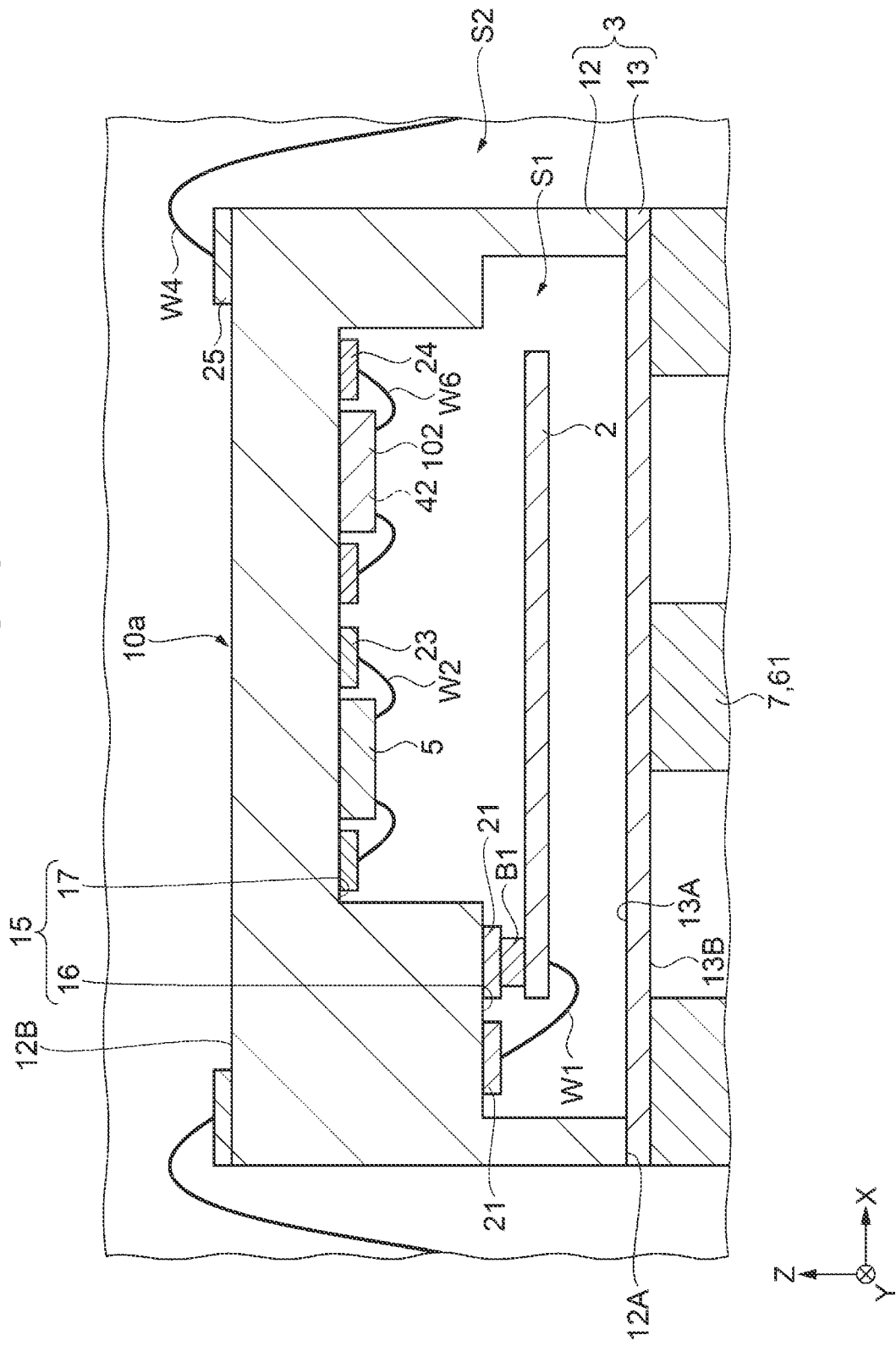
FIG. 5 is a cross-sectional view of a first resonator in FIG. 4.

As shown in FIGS. 4 and 5, the second semiconductor device 102 is accommodated in the first package 3 included in the first resonator 10a.

First, the first semiconductor device 101 as the relay substrate will be described.

As shown in FIG. 4, the first semiconductor device 101 has a flat plate shape. The first semiconductor device 101 includes a semiconductor substrate (not shown) and a circuit layer (not shown) formed on the semiconductor substrate. Specifically, the first semiconductor device 101 is an IC chip.

In the embodiment, the oscillator 1a includes the PLL circuit 43. Then, the first semiconductor device 101 includes a part of the PLL circuit 43. Specifically, the first semiconductor device 101 includes the oscillation circuit 44, the phase comparator 45, the loop filter 47, and the dividing circuit 48 as a part of the PLL circuit 43.

In addition to the heater control circuit 41 and the PLL circuit 43, the first semiconductor device 101 may include the temperature compensation circuit that corrects the resonation characteristics of the first resonator element 2 according to a temperature change, the electrostatic protection circuit, and the like.

The first semiconductor device 101 is disposed on the bottom surface of the concave portion 35 of the second package 6. The bonding member 51 is provided between a lower surface of the first semiconductor device 101 and the bottom surface of the concave portion 35, and the first semiconductor device 101 is fixed to the concave portion 35 via the bonding member 51.

The plurality of coupling terminals 53 are disposed on an upper surface of the first semiconductor device 101.

The first resonator 10a is disposed on the upper surface of the first semiconductor device 101. In other words, the first package 3 is mounted on the upper surface of the first semiconductor device 101 as the relay substrate.

The heat insulating member 7 is provided between the upper surface of the first semiconductor device 101 and the fourth surface 13B which is the lower surface of the first package 3. The first package 3 is fixed to the first semiconductor device 101 via the heat insulating member 7.

That is, the first package 3 is coupled to the second package 6 via the heat insulating member 7 provided between the first package 3 and the first semiconductor device 101, the first semiconductor device 101, and the bonding member 51 provided between the first semiconductor device 101 and the second package 6.

By providing the heat insulating member 7 between the first package 3 and the first semiconductor device 101, external heat of the oscillator 1a is less likely to be transferred to the first package 3. Therefore, the first resonator element 2 is less likely to be affected by the external heat, and the first resonator element 2 is easily maintained at the desired temperature by the heat of the heater element 5.

Next, the second semiconductor device 102 will be described.

As shown in FIG. 5, a plurality of internal terminals 24 and the second semiconductor device 102 including the oscillation circuit 42 that causes the first resonator element 2 to oscillate and generates an oscillation signal are disposed on the bottom surface of the concave portion 17 of the first base substrate 12 included in the first resonator 10a.

The second semiconductor device 102 is an IC chip.

The second semiconductor device 102 is bonded to the bottom surface of the concave portion 17 by a bonding member (not shown). That is, in the embodiment, the second semiconductor device 102 is attached to the first package 3, and specifically, the second semiconductor device 102 is accommodated in the first package 3.

The plurality of internal terminals 24 are electrically coupled to the second semiconductor device 102 via conductive bonding wires W6.

The bonding wire W6 is a metal wire formed of gold, copper, or the like. A method for coupling the internal terminal 24 and the second semiconductor device 102 is not limited to the wire bonding using a metal wire, and may be the flip chip bonding using, for example, a bump member.

The internal terminals 24 are electrically coupled to the internal terminals 21, the internal terminals 23 and the external terminals 25 via an internal wiring (not shown) formed in the first base substrate 12.

By accommodating the second semiconductor device 102 including the oscillation circuit 42 in the first package 3, a length of a wiring that electrically couples the oscillation circuit 42 and the first resonator element 2 can be made shorter than that in the first embodiment. Therefore, noise is less likely to be mixed from the wiring, and an oscillation signal with high accuracy can be generated.

The units of the oscillator 1a are described above.

In the embodiment, the oscillator 1a includes the PLL circuit 43, but the PLL circuit 43 may be omitted.

As described above, according to the embodiment, the following effects can be obtained.

The oscillator 1a includes the first resonator element 2, the first package 3 that accommodates the first resonator element 2, the first semiconductor device 101 as the relay substrate on which the first package 3 is mounted, the heater element 5 that is attached to the first package 3, the second package 6 that accommodates the first package 3, and the heat insulating member 7 that is provided between the first semiconductor device 101 and the first package 3.

Accordingly, the same effects as those according to the first embodiment can be obtained.

3. Third Embodiment

Next, an oscillator 1b according to a third embodiment will be described with reference to FIG. 6.

The oscillator 1b according to the third embodiment is similar to the oscillator 1a according to the second embodiment except that the heat insulating member 7 is provided instead of the bonding member 51 provided between the first semiconductor device 101 and the second package 6, and that a bonding member 111 is provided instead of the heat insulating member 7 provided between the first package 3 and the first semiconductor device 101.

The same components as those of the second embodiment described above are denoted by the same reference numerals, and the description thereof will be omitted.

Figure 6:
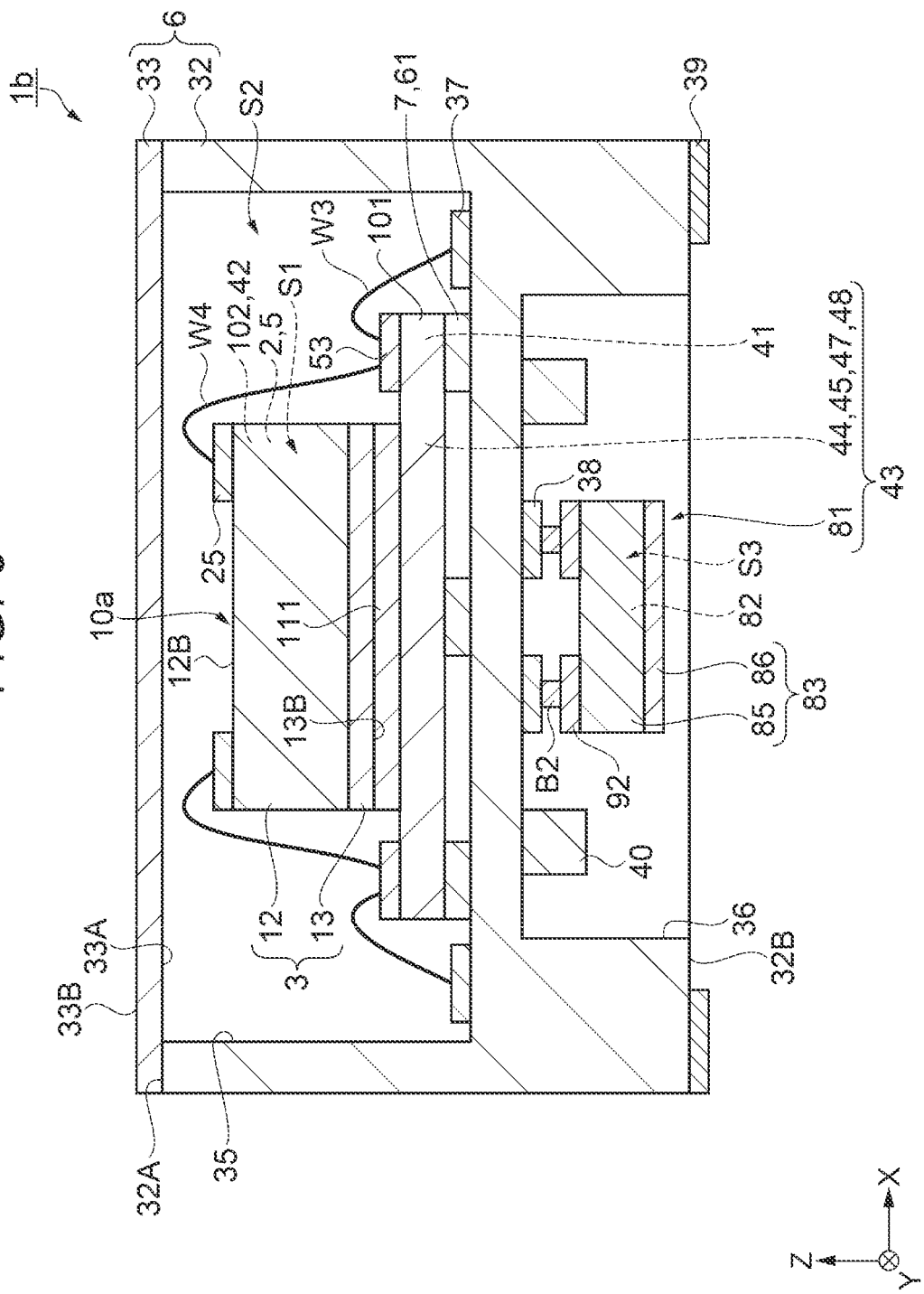
FIG. 6 is a cross-sectional view of an oscillator according to a third embodiment.

As shown in FIG. 6, in the oscillator 1b, the heat insulating member 7 is provided between the first semiconductor device 101 and the second package 6. Specifically, the heat insulating member 7 is provided between the lower surface of the first semiconductor device 101 and the bottom surface of the concave portion 35 of the second base substrate 32. The first semiconductor device 101 is fixed to the second package 6 via the heat insulating member 7.

The bonding member 111 is provided between the upper surface of the first semiconductor device 101 and the fourth surface 13B which is the lower surface of the first package 3. The first package 3 is fixed to the first semiconductor device 101 via the bonding member 111. The bonding member 111 is not particularly limited, and may be, for example, an insulating adhesive or a conductive adhesive.

The units of the oscillator 1b are described above.

By configuring the oscillator 1b in this manner, the first package 3 is coupled to the second package 6 via the bonding member 111 provided between the first package 3 and the first semiconductor device 101, the first semiconductor device 101, and the heat insulating member 7 provided between the first semiconductor device 101 and the second package 6.

By providing the heat insulating member 7 between the first semiconductor device 101 and the second package 6, external heat of the oscillator 1b is less likely to be transferred to the first package 3. Therefore, the first resonator element 2 is less likely to be affected by the external heat, and the first resonator element 2 is easily maintained at the desired temperature by the heat of the heater element 5.

In the embodiment, the heater element 5 is attached to the first package 3, but the heater element 5 may be attached to the first semiconductor device 101 as the relay substrate. In the embodiment, since the heat insulating member 7 is not provided between the first semiconductor device 101 and the first package 3, the first resonator element 2 accommodated in the first package 3 can be heated via the first semiconductor device 101 by attaching the heater element 5 to the first semiconductor device 101.

As described above, according to the embodiment, the following effects can be obtained.

The oscillator 1b includes the first resonator element 2, the first package 3 that accommodates the first resonator element 2, the first semiconductor device 101 as the relay substrate on which the first package 3 is mounted, the heater element 5 that is attached to the first package 3 or the first semiconductor device 101, the second package 6 that accommodates the first package 3, and the heat insulating member 7 that is provided between the second package 6 and the first semiconductor device 101.

Accordingly, the same effects as those according to the first embodiment can be obtained.

4. Fourth Embodiment

Next, an oscillator 1c according to a fourth embodiment will be described with reference to FIG. 7.

The oscillator 1c according to the fourth embodiment is similar to the oscillator 1a according to the second embodiment except that the heat insulating member 7 is provided instead of the bonding member 51 provided between the first semiconductor device 101 and the second package 6.

That is, in the oscillator 1c, the heat insulating member 7 is provided between the first semiconductor device 101 and the first package 3 and between the first semiconductor device 101 and the second package 6.

The same components as those of the second embodiment described above are denoted by the same reference numerals, and the description thereof will be omitted.

Figure 7:
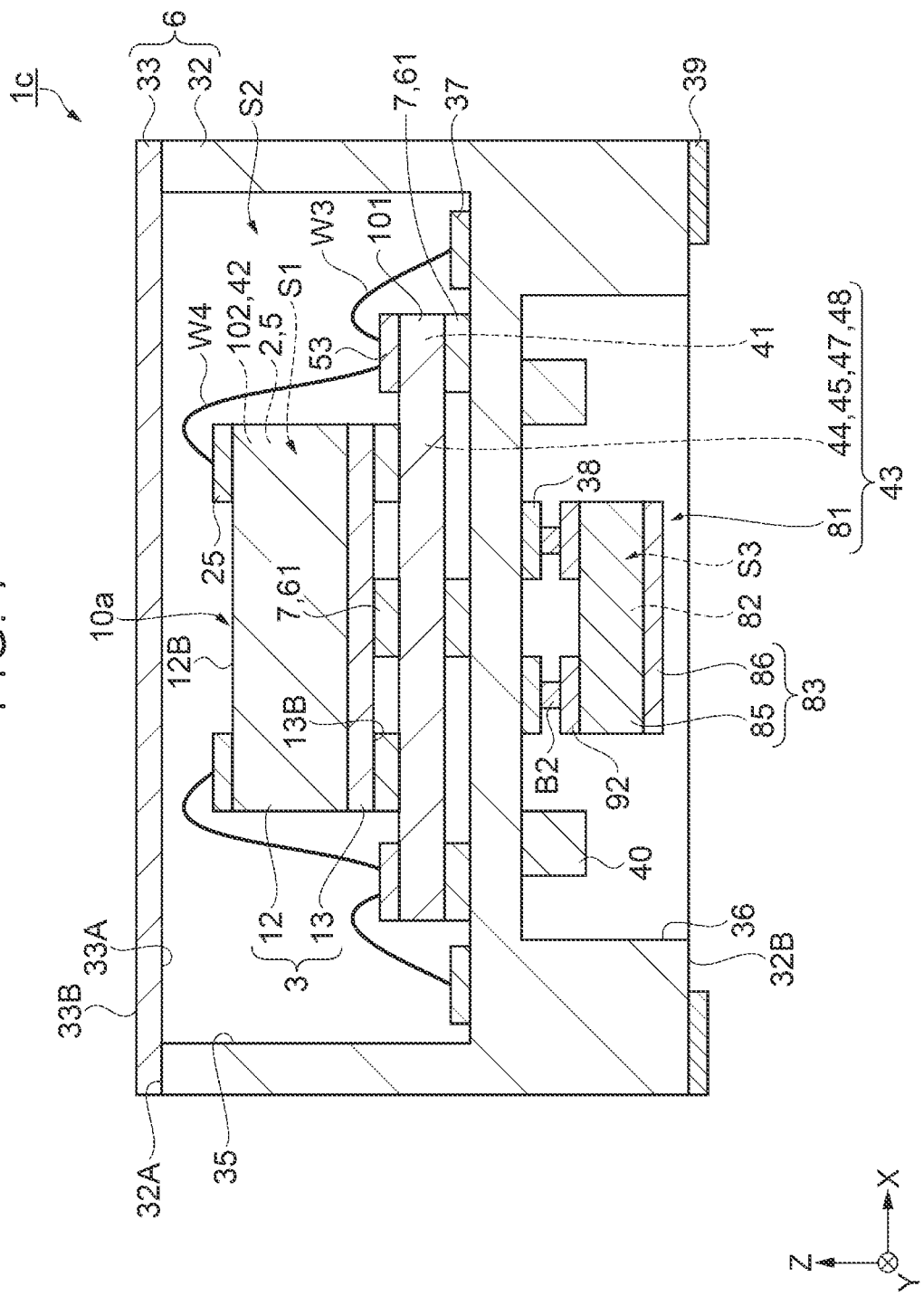
FIG. 7 is a cross-sectional view of an oscillator according to a fourth embodiment.

As shown in FIG. 7, in the oscillator 1c, the heat insulating member 7 is provided between the first semiconductor device 101 and the first package 3 and between the first semiconductor device 101 and the second package 6. Specifically, the heat insulating member 7 is provided between the upper surface of the first semiconductor device 101 and the fourth surface 13B, which is the lower surface of the first package 3, and between the lower surface of the first semiconductor device 101 and the bottom surface of the concave portion 35 of the second base substrate 32.

The first package 3 is fixed to the first semiconductor device 101 via the heat insulating member 7 provided between the first semiconductor device 101 and the first package 3. The first semiconductor device 101 is fixed to the second package 6 via the heat insulating member 7 provided between the first semiconductor device 101 and the second package 6.

The units of the oscillator 1c are described above. By configuring the oscillator 1c in this manner, the first package 3 is coupled to the second package 6 via the heat insulating member 7 provided between the first package 3 and the first semiconductor device 101, the first semiconductor device 101, and the heat insulating member 7 provided between the first semiconductor device 101 and the second package 6.

In the embodiment, similarly to the second embodiment, the heat insulating member 7 is provided between the first semiconductor device 101 and the second package 6. Accordingly, external heat of the oscillator 1c is less likely to be transferred to the first package 3. Therefore, the first resonator element 2 is less likely to be affected by the external heat, and the first resonator element 2 is easily maintained at the desired temperature by the heat of the heater element 5.

In the embodiment, the heat insulating member 7 is also provided between the first package 3 and the first semiconductor device 101. That is, the heat insulating member 7 is provided both between the second package 6 and the first semiconductor device 101 and between the first semiconductor device 101 and the first package 3. Accordingly, the external heat of the oscillator 1c is further less likely to be transferred to the first package 3. Therefore, the first resonator element 2 is further less likely to be affected by the external heat, and the first resonator element 2 is further easily maintained at the desired temperature by the heat of the heater element 5.

As described above, according to the embodiment, the following effects can be obtained.

The oscillator 1c includes the first resonator element 2, the first package 3 that accommodates the first resonator element 2, the first semiconductor device 101 as the relay substrate on which the first package 3 is mounted, the heater element 5 attached to the first package 3, the second package 6 that accommodates the first package 3, and the heat insulating member 7 that is provided between the second package 6 and the first semiconductor device 101 and between the first semiconductor device 101 and the first package 3.

As a result, the effects of the first embodiment are further improved, and the oscillation characteristics of the oscillator 1 are further stabilized.

5. Fifth Embodiment

Next, an oscillator 1d according to a fifth embodiment will be described with reference to FIGS. 8 and 9.

The oscillator 1d according to the fifth embodiment is similar to the oscillator 1 according to the first embodiment except that the PLL circuit 43 is omitted, that a wiring substrate 121 is provided as a relay substrate, that a semiconductor device 124 including the heater control circuit 41 and the oscillation circuit 42 is provided between the wiring substrate 121 and the first package 3, that the heater element 5 is fixed onto the first package 3, and that the heat insulating member 7 is provided between the second package 6 and the wiring substrate 121.

The same components as those of the first embodiment described above are denoted by the same reference numerals, and the description thereof will be omitted.

Figure 8:
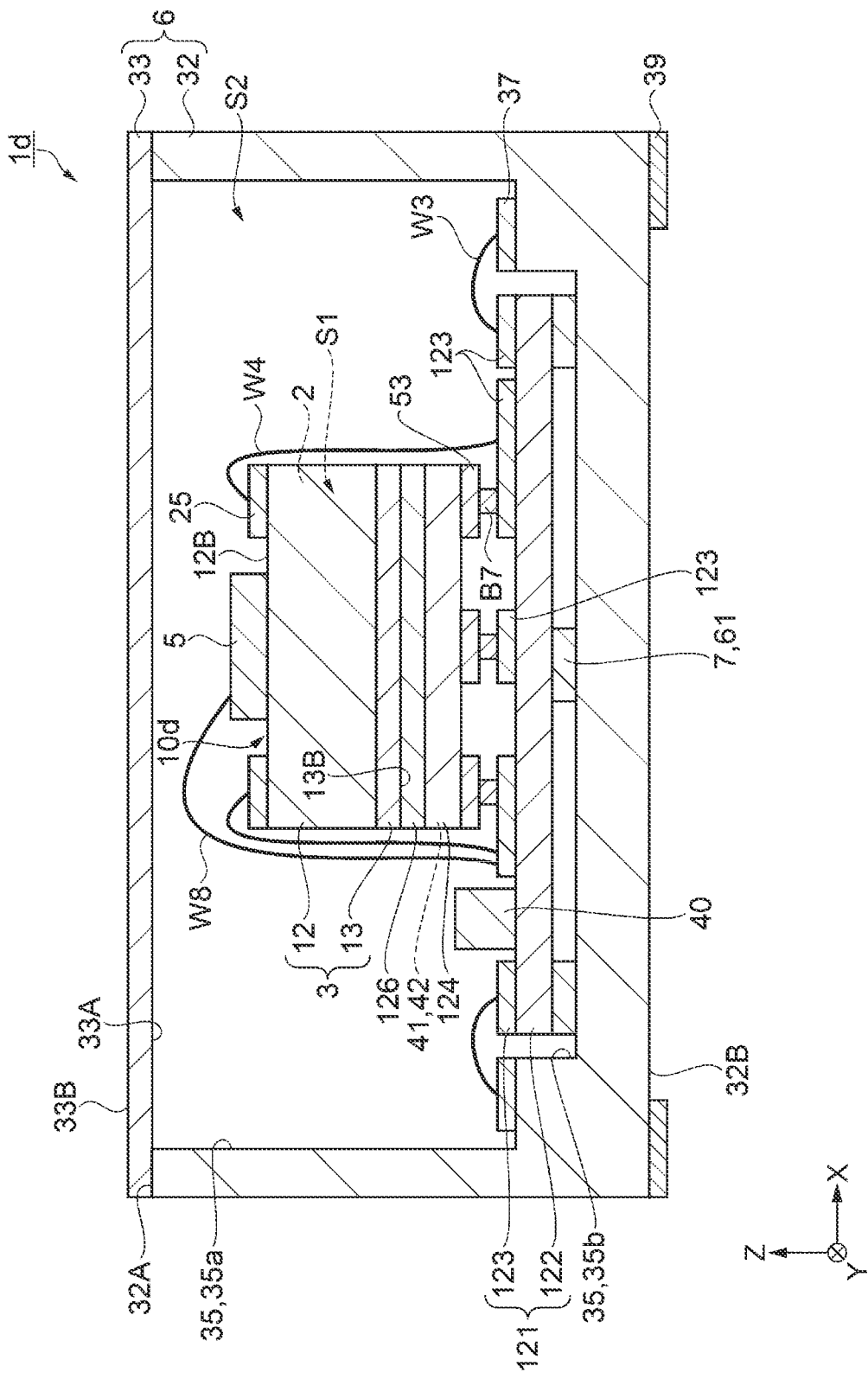
FIG. 8 is a cross-sectional view of an oscillator according to a fifth embodiment.

As shown in FIG. 8, the oscillator 1d includes the first resonator element 2, the first package 3 that accommodates the first resonator element 2, the wiring substrate 121 as the relay substrate on which the first package 3 is mounted, the heater element 5 that heats the first resonator element 2, the second package 6 that accommodates the first package 3, and the heat insulating member 7 that is provided between the second package 6 and the wiring substrate 121.

As shown in FIG. 8, the second base substrate 32 has a box shape having the concave portion 35 that opens in the upper surface 32A. In the embodiment, the second base substrate 32 does not have the concave portion 36 that opens in the lower surface 32B, but may have the concave portion 36.

In the embodiment, the concave portion 35 includes a plurality of concave portions. Specifically, the concave portion 35 includes a concave portion 35a that opens in the upper surface 32A of the second base substrate 32, and a concave portion 35b that opens in a bottom surface of the concave portion 35a and has an opening smaller than that of the concave portion 35a. However, the configuration of the concave portion 35 is not particularly limited.

The plurality of internal terminals 37 are disposed on the bottom surface of the concave portion 35a.

The wiring substrate 121 is disposed on a bottom surface of the concave portion 35b.

The heat insulating member 7 is provided between the bottom surface of the concave portion 35b and a lower surface of the wiring substrate 121. The wiring substrate 121 is fixed to the bottom surface of the concave portion 35b via the heat insulating member 7. That is, the wiring substrate 121 as the relay substrate is bonded and fixed to the second package 6 via the heat insulating member 7 provided between the wiring substrate 121 and the second package 6.

The wiring substrate 121 includes an insulating substrate 122 and conductive wiring patterns 123 formed on an upper surface of the insulating substrate 122. A quartz crystal substrate, a glass substrate, a ceramic substrate, or the like can be used as the insulating substrate 122. The wiring pattern 123 is formed by patterning gold, copper, or the like by printing or plating. The wiring patterns 123 may be formed not only on the upper surface but also on a lower surface of the insulating substrate 122. Further, a through electrode that electrically couples the upper surface and the lower surface of the insulating substrate 122 may be formed.

In the embodiment, the circuit components 40 such as bypass capacitors are disposed on an upper surface of the wiring substrate 121. The circuit components 40 are bonded to the upper surface of the wiring substrate 121 by a conductive bonding member (not shown). The circuit components 40 are electrically coupled to the wiring patterns 123 via the conductive bonding member (not shown).

Each wiring pattern 123 included in the wiring substrate 121 and each internal terminal 37 disposed on the bottom surface of the concave portion 35a of the second base substrate 32 are electrically coupled to each other via the bonding wire W3.

That is, the wiring substrate 121 as the relay substrate and the second package 6 are electrically coupled to each other via the bonding wires W3.

The semiconductor device 124 is disposed on the upper surface of the wiring substrate 121.

The semiconductor device 124 includes the heater control circuit 41 and the oscillation circuit 42.

In addition to the heater control circuit 41 and the oscillation circuit 42, the semiconductor device 124 may include the temperature compensation circuit that corrects the resonation characteristics of the first resonator element 2 according to a temperature change, the electrostatic protection circuit, and the like.

The semiconductor device 124 has a flat plate shape. The semiconductor device 124 includes a semiconductor substrate (not shown) and a circuit layer (not shown) formed on the semiconductor substrate. Specifically, the semiconductor device 124 is an IC chip.

The plurality of coupling terminals 53 are disposed on a lower surface of the semiconductor device 124.

A conductive bonding member B7 is provided between each coupling terminal 53 disposed on the lower surface of the semiconductor device 124 and each wiring pattern 123 formed on the upper surface of the wiring substrate 121. The semiconductor device 124 and the wiring substrate 121 are electrically coupled to each other via the bonding members B7. In addition, the semiconductor device 124 is fixed to the wiring substrate 121 via the bonding members B7.

The bonding member B7 is a metal bump formed of gold, copper, or the like.

A first resonator 10d is disposed on an upper surface of the semiconductor device 124.

That is, the first resonator 10d is disposed on the upper surface of the semiconductor device 124, and the wiring substrate 121 as the relay substrate is disposed on the lower surface of the semiconductor device 124. In other words, the semiconductor device 124 is provided between the wiring substrate 121 as the relay substrate and the first package 3 included in the first resonator 10d. Further, in other words, the first package 3 is mounted on the wiring substrate 121 as the relay substrate via the semiconductor device 124.

The wiring substrate 121 and the semiconductor device 124 disposed on the upper surface of the wiring substrate 121 may be collectively regarded as the relay substrate.

A bonding member 126 is provided between the upper surface of the semiconductor device 124 and the fourth surface 13B which is the lower surface of the first package 3. The first package 3 is fixed to the semiconductor device 124 via the bonding member 126. The bonding member 126 is not particularly limited, and may be, for example, an insulating adhesive or a conductive adhesive.

The external terminals 25 disposed on the second surface 12B, which is the upper surface of the first package 3, are electrically coupled to the wiring pattern 123 formed on the upper surface of the wiring substrate 121 via the bonding wires W4.

Figure 9:
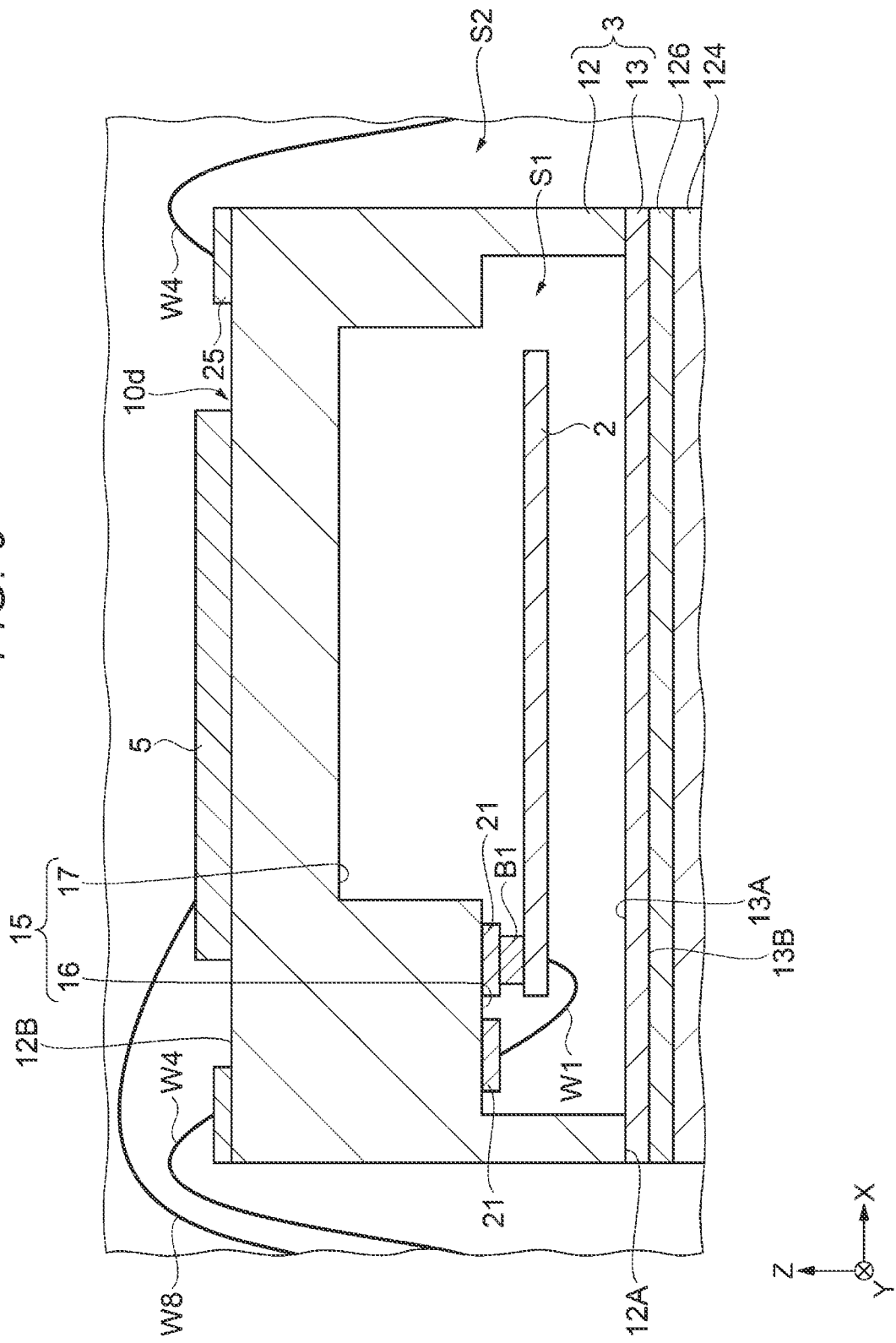
FIG. 9 is a cross-sectional view of a first resonator in FIG. 8.

As shown in FIGS. 8 and 9, the heater element 5 is attached to the first package 3 included in the first resonator 10d. However, the heater element 5 is not accommodated in the first package 3, and the heater element 5 is fixed onto the first package 3. Specifically, the heater element 5 is bonded to the second surface 12B, which is the upper surface of the first package 3, via a bonding member (not shown). The expression "fixed onto the first package 3" means that the heater element 5 is fixed not only to the upper surface of the first package 3 but also to the outer peripheral surface of the first package 3. That is, the heater element 5 may be fixed to, for example, a side surface of the first package 3.

By disposing the heater element 5 on the first package 3, the number of components accommodated in the first package 3 can be reduced. Therefore, it is possible to reduce a size of the first package 3.

As shown in FIG. 8, the heater element 5 is electrically coupled to the wiring pattern 123 included in the wiring substrate 121 via a conductive bonding wire W8.

The bonding wire W8 is a metal wire formed of gold, copper, or the like.

The units of the oscillator 1*d* are described above.

By configuring the oscillator 1*d* in this manner, the first package 3 is coupled to the second package 6 via the bonding member 126 provided between the first package 3 and the semiconductor device 124, the semiconductor device 124, the bonding members B7 provided between the semiconductor device 124 and the wiring substrate 121, the wiring substrate 121, and the heat insulating member 7 provided between the wiring substrate 121 and the second package 6.

By providing the heat insulating member 7 between the wiring substrate 121 and the second package 6, external heat of the oscillator 1*d* is less likely to be transferred to the first package 3. Therefore, the first resonator element 2 is less likely to be affected by the external heat, and the first resonator element 2 is easily maintained at the desired temperature by the heat of the heater element 5.

In the embodiment, the heater element 5 is attached to the first package 3. That is, the heat insulating member 7 is located in the middle of the heat conduction path from the heater element 5 to the second package 6.

Since the heat insulating member 7 is located in the middle of the heat conduction path from the heater element 5 to the second package 6, the heat of the heater element 5 is less likely to escape to the second package 6 via the first package 3, and the heat of the heater element 5 can be efficiently transferred to the first resonator element 2. Therefore, the heater element 5 can be efficiently driven, and the temperature of the first resonator element 2 can be further easily maintained at the desired temperature.

In the embodiment, the second package 6 and the wiring substrate 121 as the relay substrate are electrically coupled to each other via the bonding wires W3.

Since the wiring substrate 121 as the relay substrate and the second package 6 are electrically coupled to each other via the bonding wires W3, the external heat of the oscillator 1*d* is less likely to be transferred from the second package 6 to the wiring substrate 121. That is, the external heat of the oscillator 1*d* is less likely to be transferred to the first package 3. Therefore, the first resonator element 2 is less likely to be affected by the external heat, and the first resonator element 2 is easily maintained at the desired temperature by the heat of the heater element 5.

As described above, according to the embodiment, the following effects can be obtained.

The oscillator 1*d* includes the first resonator element 2, the first package 3 that accommodates the first resonator element 2, the wiring substrate 121 as the relay substrate on which the first package 3 is mounted, the heater element 5 that is attached to the first package 3, the second package 6 that accommodates the first package 3, and the heat insulating member 7 that is provided between the second package 6 and the wiring substrate 121.

Accordingly, the same effects as those according to the first embodiment can be obtained.

Although the PLL circuit 43 is omitted in the embodiment, the oscillator 1*d* may include the PLL circuit 43.

Further, for example, the semiconductor device 124 may be configured to be separated into a first semiconductor device including the heater control circuit 41 and a second semiconductor device including the oscillation circuit 42, the first semiconductor device including the heater control circuit 41 may be disposed between the first package 3 and the wiring substrate 121 as the relay substrate, and the second semiconductor device including the oscillation circuit 42 may be accommodated in the first package 3.

6. Sixth Embodiment

Next, an oscillator 1*e* according to a sixth embodiment will be described with reference to FIG. 10.

The oscillator 1*e* according to the sixth embodiment is similar to the oscillator 1*d* according to the fifth embodiment except that the heat insulating member 7 is provided instead of the bonding member 126 provided between the semiconductor device 124 and the first package 3, and that a bonding member 127 is provided instead of the heat insulating member 7 provided between the wiring substrate 121 as the relay substrate and the second package 6.

The same components as those of the fifth embodiment described above are denoted by the same reference numerals, and the description thereof will be omitted.

Figure 10:
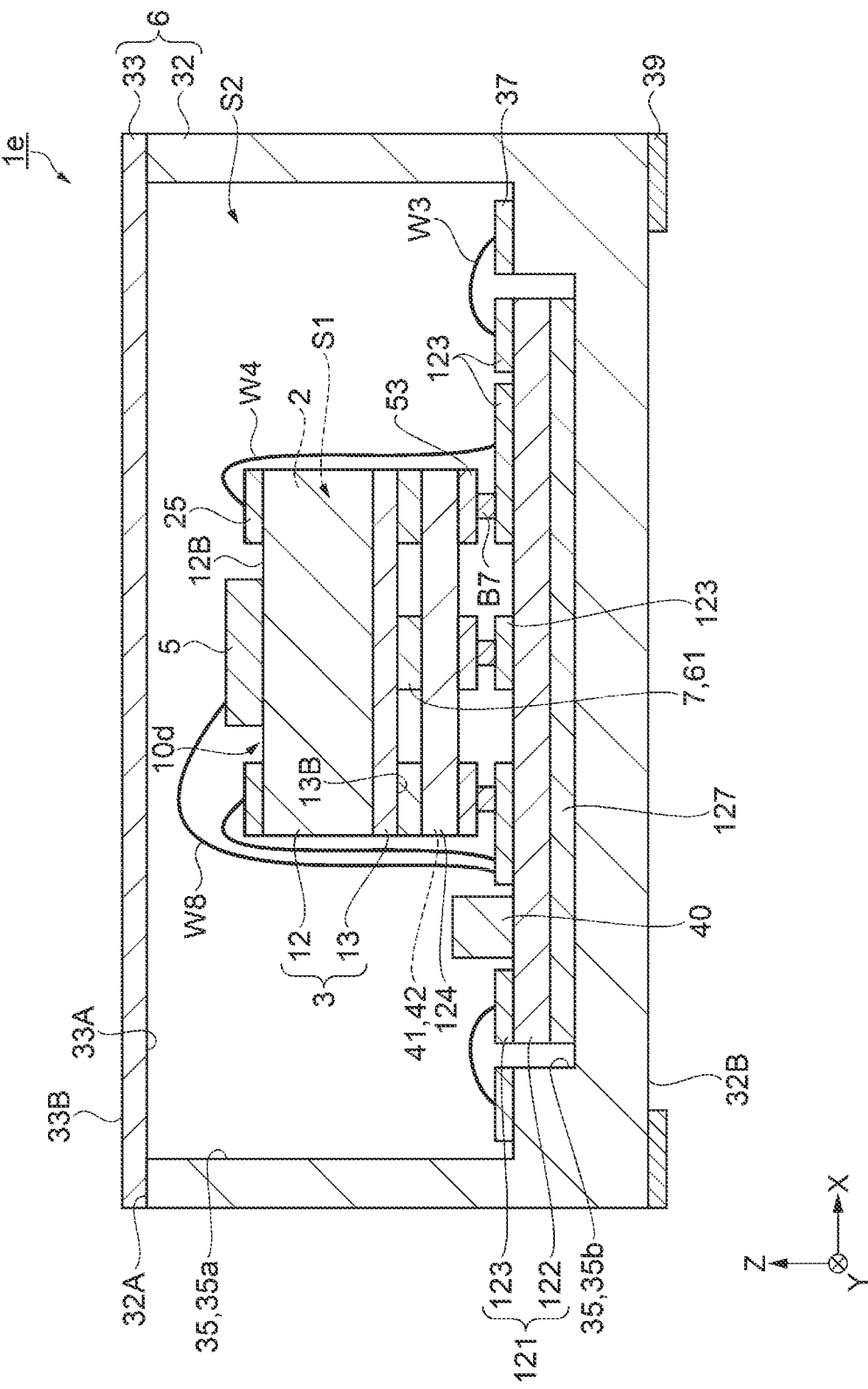
FIG. 10 is a cross-sectional view of an oscillator according to a sixth embodiment.

As shown in FIG. 10, in the oscillator 1*e*, the heat insulating member 7 is provided between the wiring substrate 121 as the relay substrate and the first package 3. Specifically, the heat insulating member 7 is provided between the first package 3 and the semiconductor device 124 provided between the wiring substrate 121 and the first package 3. More specifically, the heat insulating member 7 is provided between the upper surface of the semiconductor device 124 and the fourth surface 13B which is the lower surface of the first package 3. The first package 3 is bonded and fixed to the semiconductor device 124 via the heat insulating member 7.

The bonding member 127 is provided between the lower surface of the wiring substrate 121 and the bottom surface of the concave portion 35*b* included in the second package 6. The wiring substrate 121 is fixed to the second package 6 via the bonding member 127. The bonding member 127 is not particularly limited, and may be, for example, an insulating adhesive or a conductive adhesive.

The units of the oscillator 1*e* are described above.

By configuring the oscillator 1*e* in this manner, the first package 3 is coupled to the second package 6 via the heat insulating member 7 provided between the first package 3 and the semiconductor device 124, the semiconductor device 124, the bonding members B7 provided between the semiconductor device 124 and the wiring substrate 121, the wiring substrate 121, and the bonding member 127 provided between the wiring substrate 121 and the second package 6.

By providing the heat insulating member 7 between the first package 3 and the semiconductor device 124, external heat of the oscillator 1*e* is less likely to be transferred to the first package 3. Therefore, the first resonator element 2 is less likely to be affected by the external heat, and the first resonator element 2 is easily maintained at the desired temperature by the heat of the heater element 5.

As described above, according to the embodiment, the following effects can be obtained.

The oscillator 1*e* includes the first resonator element 2, the first package 3 that accommodates the first resonator element 2, the wiring substrate 121 as the relay substrate on which the first package 3 is mounted, the heater element 5 that is attached to the first package 3, the second package 6 that accommodates the first package 3, and the heat insulating member 7 that is provided between the wiring substrate 121 and the first package 3.

Accordingly, the same effects as those according to the first embodiment can be obtained.

7. Seventh Embodiment

Next, an oscillator if according to a seventh embodiment will be described with reference to FIG. 11.

The oscillator if according to the seventh embodiment is similar to the oscillator 1*d* according to the fifth embodiment except that the heat insulating member 7 is provided instead of the bonding member 126 provided between the semiconductor device 124 and the first package 3.

That is, in the oscillator 1*f*, the heat insulating member 7 is provided between the semiconductor device 124 and the first package 3 and between the wiring substrate 121 as the relay substrate and the second package 6.

The same components as those of the fifth embodiment described above are denoted by the same reference numerals, and the description thereof will be omitted.

Figure 11:
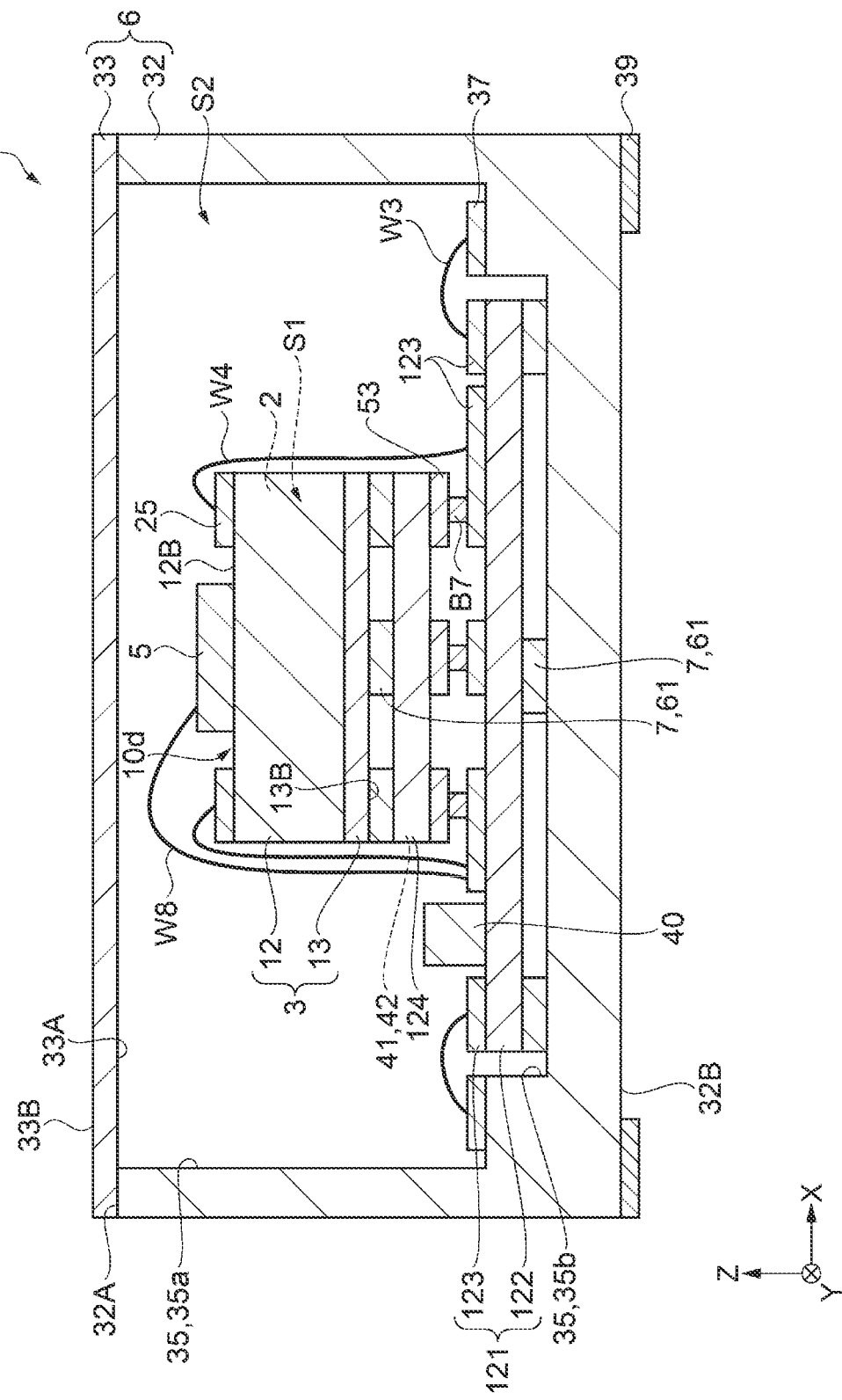
FIG. 11 is a cross-sectional view of an oscillator according to a seventh embodiment.

As shown in FIG. 11, in the oscillator 1*f*, the heat insulating member 7 is provided between the semiconductor device 124 and the first package 3 and between the wiring substrate 121 and the second package 6. Specifically, the heat insulating member 7 is provided between the upper surface of the semiconductor device 124 and the fourth surface 13B, which is the lower surface of the first package 3, and between the lower surface of the wiring substrate 121 and the bottom surface of the concave portion 35*b* included in the second base substrate 32.

The first package 3 is fixed to the semiconductor device 124 via the heat insulating member 7 provided between the semiconductor device 124 and the first package 3. The wiring substrate 121 is fixed to the second package 6 via the heat insulating member 7 provided between the wiring substrate 121 and the second package 6.

The units of the oscillator if are described above.

By configuring the oscillator if in this manner, the first package 3 is coupled to the second package 6 via the heat insulating member 7 provided between the first package 3 and the semiconductor device 124, the semiconductor device 124, the bonding members B7 provided between the semiconductor device 124 and the wiring substrate 121, the wiring substrate 121, and the heat insulating member 7 provided between the wiring substrate 121 and the second package 6.

In the embodiment, similarly to the fifth embodiment, the heat insulating member 7 is provided between the wiring substrate 121 and the second package 6. Accordingly, external heat of the oscillator if is less likely to be transferred to the first package 3. Therefore, the first resonator element 2 is less likely to be affected by the external heat, and the first resonator element 2 is easily maintained at the desired temperature by the heat of the heater element 5.

In the embodiment, the heat insulating member 7 is further provided between the semiconductor device 124 and the first package 3. That is, the heat insulating member 7 is provided both between the semiconductor device 124 and the first package 3 and between the wiring substrate 121 and the second package 6. Accordingly, the external heat of the oscillator if is further less likely to be transferred to the first package 3. Therefore, the first resonator element 2 is further less likely to be affected by the external heat, and the first resonator element 2 is further easily maintained at the desired temperature by the heat of the heater element 5.

As described above, according to the embodiment, the following effects can be obtained.

The oscillator if includes the first resonator element 2, the first package 3 that accommodates the first resonator element 2, the wiring substrate 121 as the relay substrate on which the first package 3 is mounted, the heater element 5 that is attached to the first package 3, the second package 6 that accommodates the first package 3, and the heat insulating member 7 that is provided between the second package 6 and the wiring substrate 121 and between the wiring substrate 121 and the first package 3.

As a result, the effects of the first embodiment are further improved, and the oscillation characteristics of the oscillator if are further stabilized.

8. Eighth Embodiment

Next, an oscillator 1*g* according to an eighth embodiment will be described with reference to FIGS. 12 and 13.

The oscillator 1*g* according to the eighth embodiment is similar to the oscillator 1 according to the first embodiment except that the PLL circuit 43 is omitted, that a wiring substrate 131 is provided as the relay substrate, that a first semiconductor device 137 including the heater control circuit 41 that controls the heater element 5 and a second semiconductor device 138 including the oscillation circuit 42 that causes the first resonator element 2 to oscillate and generates an oscillation signal are provided instead of the semiconductor device 4, that the first package 3 is attached to one surface of the wiring substrate 131, and the first semiconductor device 137 is attached to the other surface of the wiring substrate 131, that the second semiconductor device 138 is accommodated in the first package 3, and that the heat insulating member 7 is provided between the second package 6 and the wiring substrate 131.

A first resonator 10*g* according to the eighth embodiment is similar to the first resonator 10 according to the first embodiment except that the second semiconductor device 138 is accommodated in the first package 3 included in the first resonator 10*g* and that the first package 3 is disposed upside down as compared with the first resonator 10 according to the first embodiment.

The same components as those of the first embodiment described above are denoted by the same reference numerals, and the description thereof will be omitted.

Figure 12:
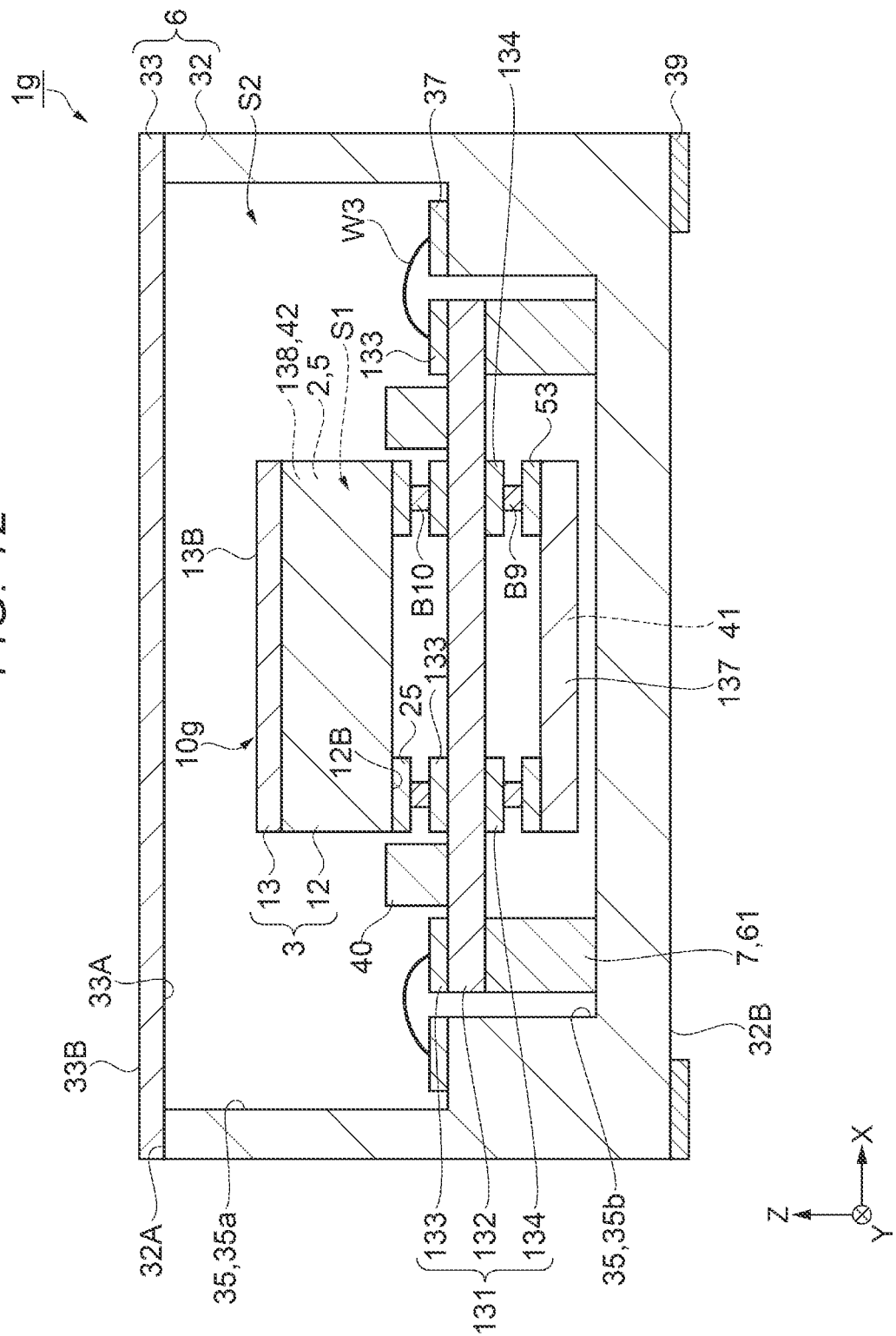
FIG. 12 is a cross-sectional view of an oscillator according to an eighth embodiment.

As shown in FIG. 12, the oscillator 1*g* includes the first resonator element 2, the first package 3 that accommodates the first resonator element 2, the wiring substrate 131 as the relay substrate on which the first package 3 is mounted, the heater element 5 that heats the first resonator element 2, the second package 6 that accommodates the first package 3, and the heat insulating member 7 that is provided between the second package 6 and the wiring substrate 131.

As shown in FIG. 12, the second base substrate 32 has a box shape having the concave portion 35 that opens in the upper surface 32A. In the embodiment, the second base substrate 32 does not have the concave portion 36 that opens in the lower surface 32B, but may have the concave portion 36.

In the embodiment, the concave portion 35 includes a plurality of concave portions. Specifically, the concave portion 35 includes the concave portion 35*a* that opens in the upper surface 32A of the second base substrate 32, and the concave portion 35*b* that opens in the bottom surface of the concave portion 35*a* and has the opening smaller than that of the concave portion 35*a*. However, the configuration of the concave portion 35 is not particularly limited.

The plurality of internal terminals 37 are disposed on the bottom surface of the concave portion 35*a*.

The wiring substrate 131 is disposed on the concave portion 35*b*.

The heat insulating member 7 is provided between the bottom surface of the concave portion 35*b* and a lower surface of the wiring substrate 131. The wiring substrate 131 is fixed to the bottom surface of the concave portion 35*b* via the heat insulating member 7. That is, the wiring substrate 131 as the relay substrate is fixed to the second package 6 via the heat insulating member 7 provided between the wiring substrate 131 and the second package 6.

The wiring substrate 131 includes an insulating substrate 132, conductive wiring patterns 133 formed on an upper surface of the insulating substrate 132, and conductive wiring patterns 134 formed on a lower surface of the insulating substrate 132. As the insulating substrate 132, a quartz crystal substrate, a glass substrate, a ceramic substrate, or the like can be used. The wiring patterns 133 and 134 are formed by patterning gold, copper, or the like by printing or plating. The wiring patterns 133 and the wiring patterns 134 are electrically coupled by a through electrode (not shown) that electrically couples the upper surface and the lower surface of the insulating substrate 132.

In the embodiment, the circuit components 40 such as bypass capacitors are disposed on an upper surface of the wiring substrate 131. The circuit components 40 are bonded to the upper surface of the wiring substrate 131 by a conductive bonding member (not shown). The circuit components 40 are electrically coupled to the wiring patterns 133 via the conductive bonding member (not shown).

Each wiring pattern 133 included in the wiring substrate 131 and each internal terminal 37 disposed on the bottom surface of the concave portion 35*a* of the second base substrate 32 are electrically coupled to each other via the bonding wire W3.

That is, the wiring substrate 131 as the relay substrate and the second package 6 are electrically coupled to each other via the bonding wires W3.

The first resonator 10*g* is disposed on the upper surface of the wiring substrate 131, and the first semiconductor device 137 is disposed on the lower surface of the wiring substrate 131.

The first semiconductor device 137 includes the heater control circuit 41.

In addition to the heater control circuit 41, the first semiconductor device 137 may include the temperature compensation circuit that corrects the resonation characteristics of the first resonator element 2 according to a temperature change, the electrostatic protection circuit, and the like.

The first semiconductor device 137 is an IC chip.

The plurality of coupling terminals 53 are disposed on an upper surface of the first semiconductor device 137.

A conductive bonding member B9 is provided between each coupling terminal 53 disposed on the upper surface of the first semiconductor device 137 and each wiring pattern 134 included in the wiring substrate 131. The first semiconductor device 137 and the wiring substrate 131 are electrically coupled to each other via the bonding members B9. In addition, the first semiconductor device 137 is fixed to the wiring substrate 131 via the bonding members B9.

The bonding member B9 is a metal bump formed of gold, copper, or the like.

Figure 13:
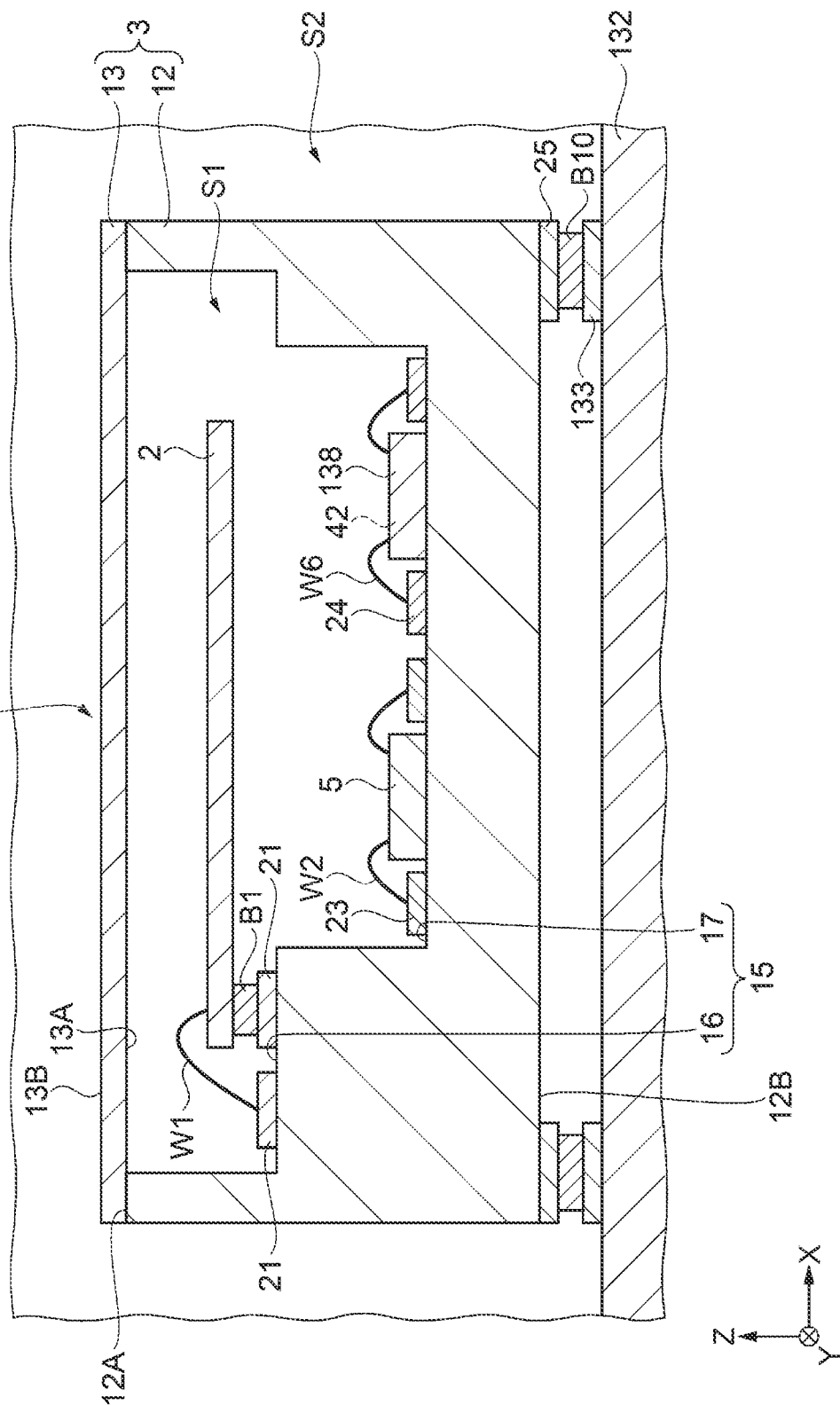
FIG. 13 is a cross-sectional view of a first resonator in FIG. 12.

As shown in FIGS. 12 and 13, the first resonator 10*g* disposed on the upper surface of the wiring substrate 131 is disposed such that the first package 3 is disposed upside down as compared with the first resonator 10 according to the first embodiment. That is, the first resonator 10*g* is disposed such that the upper surface of the first package 3 becomes the fourth surface 13B of the first lid 13 and the lower surface of the first package 3 becomes the second surface 12B of the first base substrate 12.

As shown in FIG. 13, the plurality of internal terminals 24 and the second semiconductor device 138 are disposed on the bottom surface of the concave portion 17 of the first base substrate 12.

The second semiconductor device 138 includes the oscillation circuit 42 that causes the first resonator element 2 to oscillate so as to generate an oscillation signal.

The second semiconductor device 138 is an IC chip.

The second semiconductor device 138 is bonded to the bottom surface of the concave portion 17 by a bonding member (not shown). That is, in the embodiment, the second semiconductor device 138 is attached to the first package 3, and specifically, the second semiconductor device 138 is accommodated in the first package 3.

The plurality of internal terminals 24 are electrically coupled to the second semiconductor device 138 via the conductive bonding wires W6.

The bonding wire W6 is a metal wire formed of gold, copper, or the like. A method for coupling the internal terminal 24 and the second semiconductor device 138 is not limited to the wire bonding using a metal wire, and may be the flip chip bonding using, for example, a bump member.

The internal terminals 24 are electrically coupled to the internal terminals 21, the internal terminals 23 and the external terminals 25 via an internal wiring (not shown) formed in the first base substrate 12.

The heater element 5 is bonded to the bottom surface of the concave portion 17 by a bonding member (not shown). That is, in the embodiment, the heater element 5 is attached to the first package 3, and specifically, the heater element 5 is accommodated in the first package 3.

As shown in FIG. 12, the first resonator 10*g* is disposed on the upper surface of the wiring substrate 131 as the relay substrate.

A conductive bonding member B10 is provided between each wiring pattern 133 included in the wiring substrate 131 and each external terminal 25 disposed on the second surface 12B which is the lower surface of the first package 3. The first package 3 and the wiring substrate 131 are electrically coupled to each other via the bonding members B10. In addition, the first package 3 is fixed to the wiring substrate 131 via the bonding members B10.

The bonding member B10 is a metal bump formed of gold, copper, or the like.

The units of the oscillator 1*g* are described above.

By configuring the oscillator 1*g* in this manner, the first package 3 is coupled to the second package 6 via the bonding members B10 provided between the first package 3 and the wiring substrate 131, the wiring substrate 131, and the heat insulating member 7 provided between the wiring substrate 131 and the second package 6.

By providing the heat insulating member 7 between the wiring substrate 131 and the second package 6, external heat of the oscillator 1*g* is less likely to be transferred to the first package 3. Therefore, the first resonator element 2 is less likely to be affected by the external heat, and the first resonator element 2 is easily maintained at the desired temperature by the heat of the heater element 5.

In the embodiment, the heater element 5 is attached to the first package 3. That is, the heat insulating member 7 is located in the middle of the heat conduction path from the heater element 5 to the second package 6.

Since the heat insulating member 7 is located in the middle of the heat conduction path from the heater element 5 to the second package 6, the heat of the heater element 5 is less likely to escape to the second package 6 via the first package 3, and the heat of the heater element 5 can be efficiently transferred to the first resonator element 2. Therefore, the heater element 5 can be efficiently driven, and the temperature of the first resonator element 2 can be further easily maintained at the desired temperature.

In the embodiment, the second package 6 and the wiring substrate 131 as the relay substrate are electrically coupled to each other via the bonding wires W3.

Since the wiring substrate 131 as the relay substrate and the second package 6 are electrically coupled to each other via the bonding wires W3, the external heat of the oscillator 1g is less likely to be transferred from the second package 6 to the wiring substrate 131. That is, the external heat of the oscillator 1g is less likely to be transferred to the first package 3. Therefore, the first resonator element 2 is less likely to be affected by the external heat, and the first resonator element 2 is easily maintained at the desired temperature by the heat of the heater element 5.

As described above, according to the embodiment, the following effects can be obtained.

The oscillator 1g includes the first resonator element 2, the first package 3 that accommodates the first resonator element 2, the wiring substrate 131 as the relay substrate on which the first package 3 is mounted, the heater element 5 that is attached to the first package 3, the second package 6 that accommodates the first package 3, and the heat insulating member 7 that is provided between the second package 6 and the wiring substrate 131.

Accordingly, the same effects as those according to the first embodiment can be obtained.

Although the PLL circuit 43 is omitted in the embodiment, the oscillator 1g may include the PLL circuit 43.

The second semiconductor device 138 may be omitted, and the oscillation circuit 42 may be included in the first semiconductor device 137.

In the embodiment, the first resonator 10g is disposed on the upper surface of the wiring substrate 131 as the relay substrate, and the first semiconductor device 137 is disposed on the lower surface of the wiring substrate 131, but the first semiconductor device 137 may be disposed on the upper surface of the wiring substrate 131 as the relay substrate, and the first resonator 10g may be disposed on the lower surface of the wiring substrate 131.

9. Ninth Embodiment

Next, an oscillator 1h according to a ninth embodiment will be described with reference to FIGS. 14 and 15.

The oscillator 1h according to the ninth embodiment is similar to the oscillator 1g according to the eighth embodiment except that the heater element 5 is included in a first semiconductor device 141.

That is, the oscillator 1h according to the ninth embodiment includes the first semiconductor device 141 including the heater element 5 and the heater control circuit 41 that controls the heater element 5, and the second semiconductor device 138 including the oscillation circuit 42 that causes the first resonator element 2 to oscillate so as to generate an oscillation signal.

The same components as those of the eighth embodiment described above are denoted by the same reference numerals, and the description thereof will be omitted.

Figure 14:
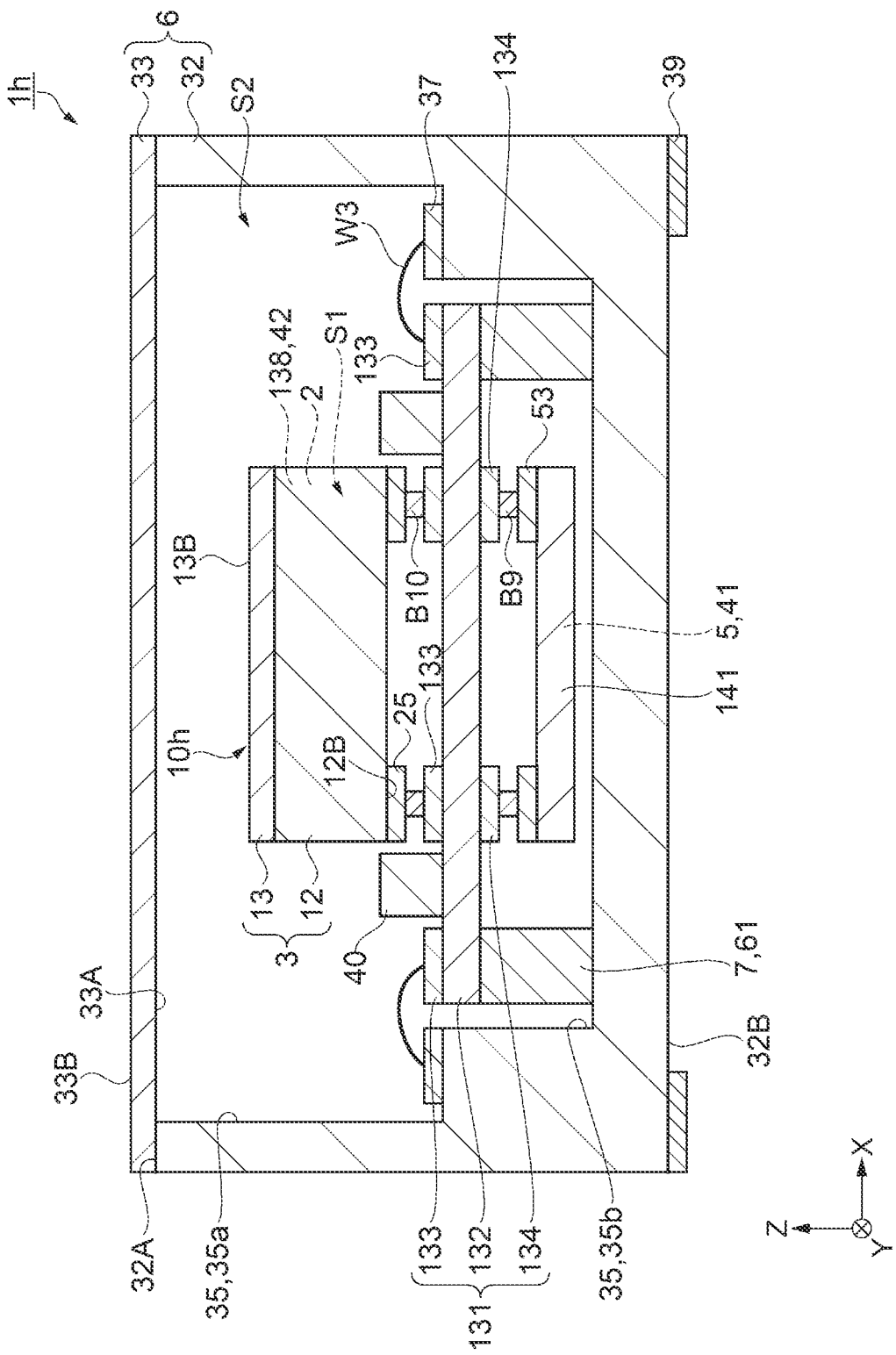
FIG. 14 is a cross-sectional view of an oscillator according to a ninth embodiment.

As shown in FIG. 14, the heat insulating member 7 is provided between the second package 6 and the wiring substrate 131 as the relay substrate. A first resonator 10h is disposed on the upper surface of the wiring substrate 131, and the first semiconductor device 141 is disposed on the lower surface of the wiring substrate 131.

The first semiconductor device 141 includes the heater element 5 and the heater control circuit 41. That is, the first semiconductor device 141 includes a heating circuit (not shown) and a temperature sensor (not shown) as the heater element 5, and the heater control circuit 41.

In addition to the heater element 5 and the heater control circuit 41, the first semiconductor device 141 may include the temperature compensation circuit that corrects the resonation characteristics of the first resonator element 2 according to a temperature change, the electrostatic protection circuit, and the like.

The first semiconductor device 141 is an IC chip.

The plurality of coupling terminals 53 are disposed on an upper surface of the first semiconductor device 141.

The conductive bonding member B9 is provided between each coupling terminal 53 disposed on the upper surface of the first semiconductor device 141 and each wiring pattern 134 formed on the lower surface of the wiring substrate 131. The first semiconductor device 141 and the wiring substrate 131 are electrically coupled to each other via the bonding members B9. In addition, the first semiconductor device 141 is fixed to the wiring substrate 131 via the bonding members B9.

Figure 15:
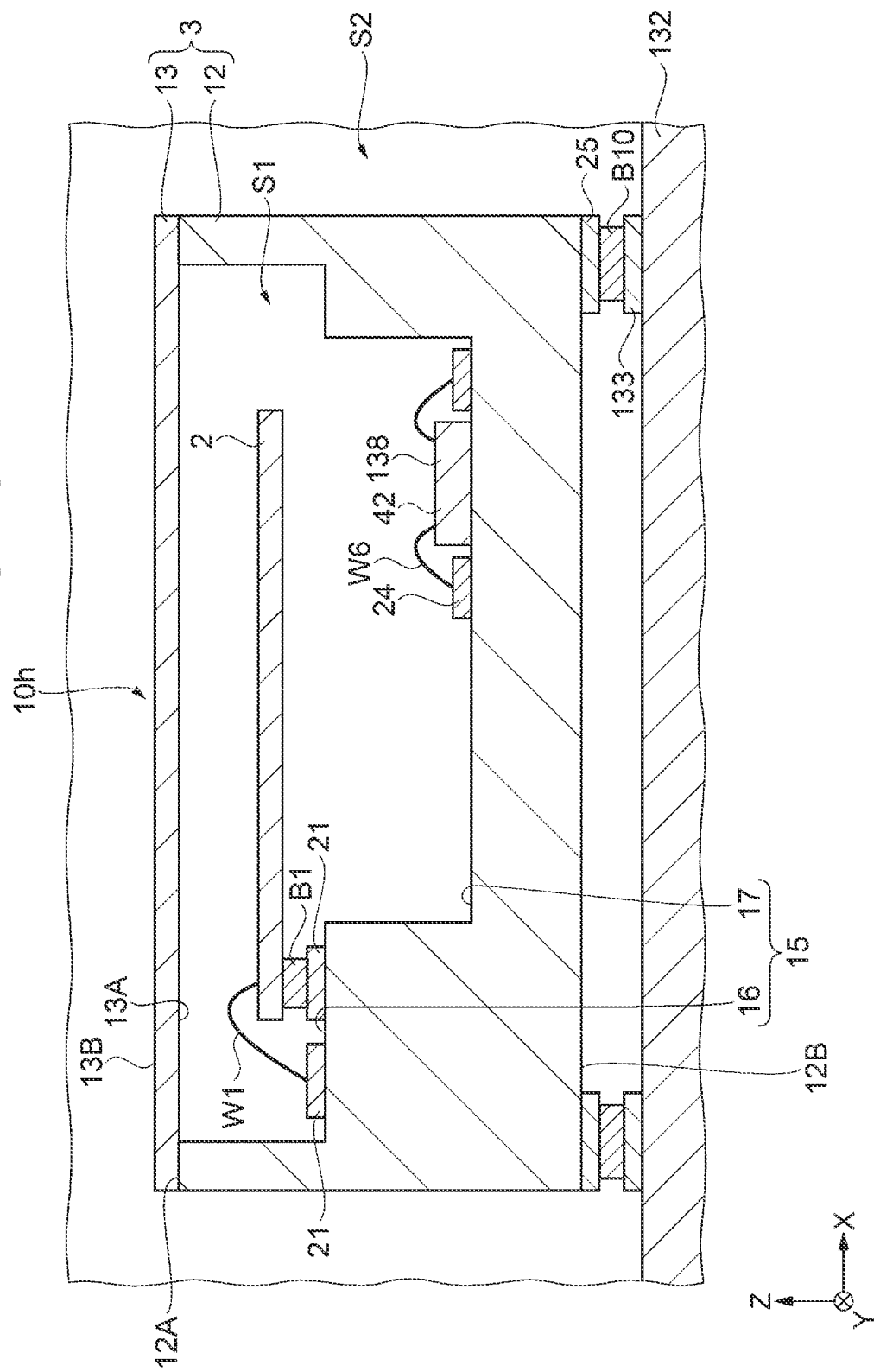
FIG. 15 is a cross-sectional view of a first resonator in FIG. 14.

As shown in FIGS. 14 and 15, the heater element 5 is not attached to the first package 3 and is included in the first semiconductor device 141.

As shown in FIG. 14, the first resonator 10h is disposed on the upper surface of the wiring substrate 131 as the relay substrate.

The conductive bonding member B10 is provided between each wiring pattern 133 formed on the upper surface of the wiring substrate 131 and each external terminal 25 disposed on the second surface 12B which is the lower surface of the first package 3. The first package 3 and the wiring substrate 131 are electrically coupled to each other via the bonding members B10. In addition, the first package 3 is fixed to the wiring substrate 131 via the bonding members B10.

The units of the oscillator 1h are described above.

By configuring the oscillator 1h in this manner, the first package 3 is coupled to the second package 6 via the bonding members B10 provided between the first package 3 and the wiring substrate 131, the wiring substrate 131, and the heat insulating member 7 provided between the wiring substrate 131 and the second package 6.

By providing the heat insulating member 7 between the wiring substrate 131 and the second package 6, external heat of the oscillator 1h is less likely to be transferred to the first package 3. Therefore, the first resonator element 2 is less likely to be affected by the external heat, and the first resonator element 2 is easily maintained at the desired temperature by the heat of the heater element 5.

In the embodiment, the second package 6 and the wiring substrate 131 as the relay substrate are electrically coupled to each other via the bonding wires W3.

Since the wiring substrate 131 as the relay substrate and the second package 6 are electrically coupled to each other via the bonding wires W3, the external heat of the oscillator 1h is less likely to be transferred from the second package 6 to the wiring substrate 131. That is, the external heat of the oscillator 1h is less likely to be transferred to the first package 3. Therefore, the first resonator element 2 is less likely to be affected by the external heat, and the first resonator element 2 is easily maintained at the desired temperature by the heat of the heater element 5.

In addition, in the embodiment, the first semiconductor device 141 including the heater element 5 is fixed to the wiring substrate 131 via the bonding members B9. That is, the heater element 5 is attached to the wiring substrate 131 as the relay substrate.

The heater element 5 is coupled to the second package 6 via the bonding members B9 provided between the first semiconductor device 141 including the heater element 5 and the wiring substrate 131, the wiring substrate 131, and the heat insulating member 7 provided between the wiring substrate 131 and the second package 6.

As described above, the heat insulating member 7 is located in the middle of the heat conduction path from the heater element 5 to the second package 6. Since the heat insulating member 7 is located in the middle of the heat conduction path from the heater element 5 to the second package 6, the heat of the heater element 5 is less likely to escape to the second package 6, and the heat of the heater element 5 can be efficiently transferred to the first resonator element 2. Therefore, the heater element 5 can be efficiently driven, and the temperature of the first resonator element 2 can be further easily maintained at the desired temperature.

As described above, according to the embodiment, the following effects can be obtained.

The oscillator 1h includes the first resonator element 2, the first package 3 that accommodates the first resonator element 2, the wiring substrate 131 as the relay substrate on which the first package 3 is mounted, the heater element 5 that is attached to the wiring substrate 131, the second package 6 that accommodates the first package 3, and the heat insulating member 7 that is provided between the second package 6 and the wiring substrate 131.

Accordingly, the same effects as those according to the first embodiment can be obtained.

Although the PLL circuit 43 is omitted in the embodiment, the oscillator 1h may include the PLL circuit 43.

The second semiconductor device 138 may be omitted, and the oscillation circuit 42 may be included in the first semiconductor device 141.

In the embodiment, the first resonator 10h is disposed on the upper surface of the wiring substrate 131 as the relay substrate, and the first semiconductor device 141 is disposed on the lower surface of the wiring substrate 131, but the first semiconductor device 141 may be disposed on the upper surface of the wiring substrate 131, and the first resonator 10h may be disposed on the lower surface of the wiring substrate 131. In other words, in the embodiment, the first package 3 is attached to the upper surface of the wiring substrate 131, and the heater element 5 is attached to the lower surface of the wiring substrate 131, but the heater element 5 may be attached to the upper surface of the wiring substrate 131, and the first package 3 may be attached to the lower surface of the wiring substrate 131. That is, the heater element 5 may be attached to one surface of the wiring substrate 131 as the relay substrate, and the first package 3 may be attached to the other surface having a front-back relationship with the one surface of the wiring substrate 131.

The oscillator 1 and the oscillators 1a to 1h are described above. The present disclosure is not limited thereto, and a configuration of each part can be replaced with a configuration having the same function. In addition, any other constituents may be added to the present disclosure. The embodiments may be combined as appropriate.

For example, the semiconductor device 4, the first semiconductor devices 101, 137, and 141, and the second semiconductor devices 102 and 138 may include temperature sensors. The heater control circuit 41 may control the heater element 5 based on output signals of the temperature sensors included in the semiconductor device 4, the first semiconductor devices 101, 137, and 141, and the second semiconductor devices 102 and 138.

What is claimed is:

1. An oscillator comprising:
a first resonator element;
a first package that accommodates the first resonator element;
a relay substrate on which the first package is mounted;
a heater element that is attached to the first package or the relay substrate;
a second package that accommodates the first package; and
a heat insulating member that is provided between the relay substrate and the first package.

2. The oscillator according to claim 1, wherein the heat insulating member is located in the middle of a heat conduction path from the heater element to the second package.

3. The oscillator according to claim 1, wherein the heat insulating member includes a plurality of coupling portions.

4. The oscillator according to claim 1, wherein the relay substrate and the second package are electrically coupled to each other via a bonding wire.

5. The oscillator according to claim 1, wherein the heater element is accommodated in the first package.

6. The oscillator according to claim 1, wherein the relay substrate is a first semiconductor device including a heater control circuit configured to control the heater element, and a second semiconductor device including an oscillation circuit configured to cause the first resonator element to oscillate and generate an oscillation signal is accommodated in the first package.

7. The oscillator according to claim 6, further comprising:
a second resonator element that is configured to control an oscillation frequency based on the oscillation signal generated by the oscillation circuit; and
a third package that accommodates the second resonator element, wherein
the third package is attached to the second package.

8. The oscillator according to claim 1, further comprising:
a semiconductor device between the relay substrate and the first package, wherein
the heater element is fixed to the first package,
the semiconductor device includes a heater control circuit configured to control the heater element, and an oscillation circuit configured to cause the first resonator element to oscillate and generate an oscillation signal, and
the semiconductor device and the first package are bonded by the heat insulating member.

9. The oscillator according to claim 1, wherein the heater element is attached to one surface of the relay substrate, and the first package is attached to another surface of the relay substrate.

10. The oscillator according to claim 1, wherein an inside of the second package is depressurized.

11. An oscillator comprising:
a first resonator element;
a first package that accommodates the first resonator element;
a relay substrate on which the first package is mounted;
a heater element that is attached to the first package or the relay substrate;
a second package that accommodates the first package; and
a heat insulating member that is provided at least between the second package and the relay substrate or between the relay substrate and the first package,
wherein the relay substrate is a first semiconductor device including a heater control circuit configured to control the heater element, and
a second semiconductor device including an oscillation circuit configured to cause the first resonator element to oscillate and generate an oscillation signal is accommodated in the first package.

12. An oscillator comprising:
a first resonator element;
a first package that accommodates the first resonator element;
a relay substrate on which the first package is mounted;
a semiconductor device between the relay substrate and the first package;
a heater element that is attached to the first package or the relay substrate;
a second package that accommodates the first package; and
a heat insulating member that is provided at least between the second package and the relay substrate or between the relay substrate and the first package,
wherein the heater element is fixed to the first package,
the semiconductor device includes a heater control circuit configured to control the heater element, and an oscillation circuit configured to cause the first resonator element to oscillate and generate an oscillation signal, and
at least the second package and the relay substrate, or the semiconductor device and the first package are bonded by the heat insulating member.

* * * * *